(12) United States Patent
Tsuzuki et al.

(10) Patent No.: US 6,848,153 B2
(45) Date of Patent: Feb. 1, 2005

(54) METHOD OF MANUFACTURING A SURFACE ACOUSTIC WAVE DEVICE

(75) Inventors: Shigeru Tsuzuki, Osaka (JP); Kunihiro Fujii, Osaka (JP); Masahiro Takada, Osaka (JP); Satoshi Matsuo, Kyoto (JP); Takafumi Koga, Osaka (JP); Kozo Murakami, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/315,091

(22) Filed: Dec. 10, 2002

(65) Prior Publication Data

US 2003/0127943 A1 Jul. 10, 2003

Related U.S. Application Data

(62) Division of application No. 09/890,914, filed as application No. PCT/JP00/00638 on Feb. 7, 2000, now Pat. No. 6,534,901.

(30) Foreign Application Priority Data

| Feb. 8, 1999 | (JP) | ............................................ 11-029571 |
| Jan. 20, 2000 | (JP) | ....................................... 2000-011451 |

(51) Int. Cl.⁷ .............................................. H04R 17/00
(52) U.S. Cl. .......................... 29/25.35; 29/825; 29/412; 29/417; 29/841; 29/855
(58) Field of Search ................................ 29/25.35, 825, 29/412, 417, 841, 855; 310/348, 313 R, 344

(56) References Cited

U.S. PATENT DOCUMENTS

| 4,090,153 A | * 5/1978 | Toda et al. .................. 333/151 |
| 4,575,653 A | 3/1986 | Sinha |
| 4,666,822 A | 5/1987 | Sinha |
| 4,931,752 A | 6/1990 | Bray et al. .................. 29/25.35 |
| 5,215,546 A | 6/1993 | Cho et al. .................... 29/25.01 |
| 5,469,170 A | 11/1995 | Mariani .................... 310/313 D |
| 5,594,979 A | 1/1997 | Borchelt et al. ........... 29/25.35 |
| 5,920,142 A | * 7/1999 | Onishi et al. ............ 310/313 R |
| 6,150,071 A | * 11/2000 | Harvey et al. .............. 430/312 |
| 6,154,940 A | * 12/2000 | Onishi et al. ............... 29/25.35 |

FOREIGN PATENT DOCUMENTS

| JP | 57-128237 | 8/1982 | |
| JP | 57-186819 | 11/1982 | ............ H03H/9/64 |
| JP | 58-92117 | 6/1983 | |
| JP | 58092117 A | 6/1983 | |
| JP | 5974719 | 4/1984 | |
| JP | 59-74719 | 4/1984 | |
| JP | 60-149214 | 8/1985 | |
| JP | 61-192110 | 8/1986 | |
| JP | 63178615 A | 7/1988 | |
| JP | 63-178615 | 7/1988 | |
| JP | 2-32612 | 2/1990 | |
| JP | 02174412 A | 7/1990 | |

(List continued on next page.)

Primary Examiner—Carl J. Arbes
Assistant Examiner—Tai Van Nguyen
(74) Attorney, Agent, or Firm—McDermott Will & Emery LLP

(57) ABSTRACT

A method of manufacture of a surface acoustic wave device which includes a step of applying a photosensitive film resist on a substrate and forming a photosensitive film resist layer over at least a portion of a surface of the substrate; a step of forming acoustic absorbers only at the two sides orthogonal to the direction of the surface acoustic wave transmission; a step of placing in a package a surface acoustic wave element obtained by cutting and dividing the substrate and electrically connecting a connection electrode of the surface acoustic wave element with an external terminal of the package; and a step of sealing an opening of the package with a lid, wherein the main surface of the acoustic absorbers is formed parallel to the surface of the substrate.

10 Claims, 24 Drawing Sheets

FOREIGN PATENT DOCUMENTS

| | | | |
|---|---|---|---|
| JP | 2-174412 | 7/1990 | |
| JP | 04027514 A | 1/1992 | |
| JP | 4-258009 | 9/1992 | ............ H03H/9/25 |
| JP | 4-275714 | 10/1992 | |
| JP | 7-99420 | 4/1995 | |
| JP | 8-97673 | 4/1996 | |
| JP | 08097673 A | 4/1996 | |
| JP | 08111629 A | 4/1996 | |
| JP | 8-111629 | 4/1996 | |
| JP | 08307197 A | 11/1996 | |
| JP | 8-307197 | 11/1996 | |
| JP | 10-233641 | 9/1998 | |
| JP | 11-251867 | 9/1999 | ............ H03H/9/25 |
| JP | 11-284486 | 10/1999 | |
| JP | 2000-252787 | 9/2000 | ............ H03H/9/25 |

\* cited by examiner

US 6,848,153 B2

METHOD OF MANUFACTURING A SURFACE ACOUSTIC WAVE DEVICE

This application is a divisional of U.S. patent application Ser. No. 09/890,914, filed Nov. 21, 2001, now U.S. Pat. No. 6,534,901, which is a 371 of PCT/JP00/00638, filed Feb. 7, 2000.

TECHNICAL FIELD OF THE INVENTION

The present invention relates to a surface acoustic wave device for use in wireless communications equipment and the like and method of manufacture thereof.

BACKGROUND OF THE TECHNOLOGY

FIG. 23 is a cross-sectional view of a conventional surface acoustic wave device (hereinafter SAW device). Referring to FIG. 23, a description will be given below on the method of manufacture of the conventional SAW device.

First, interdigital transducer electrodes (IDT electrodes) 101 and connection electrodes 102 are formed by forming vacuum deposited aluminum film on a disk (wafer) of piezoelectric material followed by exposing with a pattern of predetermined configuration and developing. Subsequently, acoustic absorbers 103 are formed by coating a silicone resin on both sides of the IDT electrodes 101 by screen printing and heat treatment. In this way, a number of surface acoustic wave elements 105 (SAW elements) are collectively formed on the wafer. Subsequently, the wafer is diced into individual SAW elements 105.

Next, a SAW element 105 is secured with adhesive 108 in a package 107 having external terminals 106, and the external terminals 106 and connection electrodes 102 are electrically connected with thin metal wires 109. Subsequently, opening of the package 107 is sealed with a lid 110.

When the acoustic absorbers 103 are formed by screen printing in this manner, the dimensional accuracy is poor and also their cross sections become dome-like due to drips caused by flow of the resin, thus suffering from the upper surfaces becoming curved and difficulty in forming with a uniform height.

Furthermore, when mounting the SAW element 105 in the package 107, as the SAW element 105 is transferred by sucking its surface with a vacuum chuck, there is a difficulty in sucking because the top surfaces of the acoustic absorbers 103 are curved and their heights are different. In addition, piezoelectric substrate 100 may incline relative to the bottom surface of the package 107 thus presenting a possibility of causing mounting failure.

FIG. 24 is a cross-sectional view of another conventional SAW device. While thin metal wires 109 connect the connection electrodes 102 and the external terminals 106 in the conventional SAW device of FIG. 23, in another conventional SAW device shown in FIG. 24, projecting electrodes 111 (bumps) make the connection.

In this case, too, there is a possibility of causing connection failure when the heights of the acoustic absorbers 103 are non-uniform and are greater than the bumps 111.

DISCLOSURE OF THE INVENTION

The present invention addresses the above issues and aims at providing a SAW device that can prevent mounting failure when mounting a SAW element in a package.

In order to attain this object, the SAW device of the present invention comprises a package having an external terminal, a SAW element housed in the package, and a lid for sealing opening of the package, wherein the SAW element further comprises on the surface of a piezoelectric substrate at least an IDT electrode, a connection electrode electrically connected to the IDT electrode, and an acoustic absorber formed on the outside of the IDT electrode, that is, on an end portion of the piezoelectric substrate, in a manner such that its top surface is parallel to the main surface of the piezoelectric substrate. As the surface of the acoustic absorber is parallel to the main surface of the piezoelectric substrate in this way, and as the top surface of the acoustic absorber is a plane, it is easy to suck the SAW element with a vacuum chuck when mounting in a package and it is possible to securely mount it at a predetermined position of the package.

DESCRIPTION OF THE PREFERRED EMBODIMENTS

Referring to drawings, a description will be given below on exemplary embodiments of the SAW device and method of manufacture thereof of the present invention.

Figure 1:
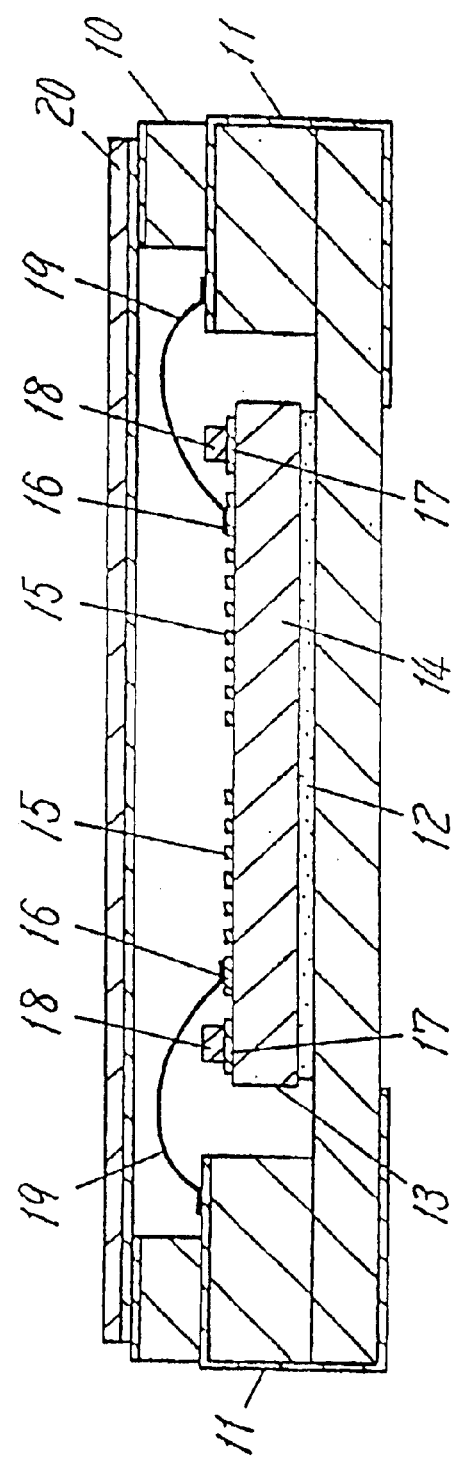
FIG. 1 is a cross-sectional view of a SAW device in a first exemplary embodiment of the present invention.
Figure 2:
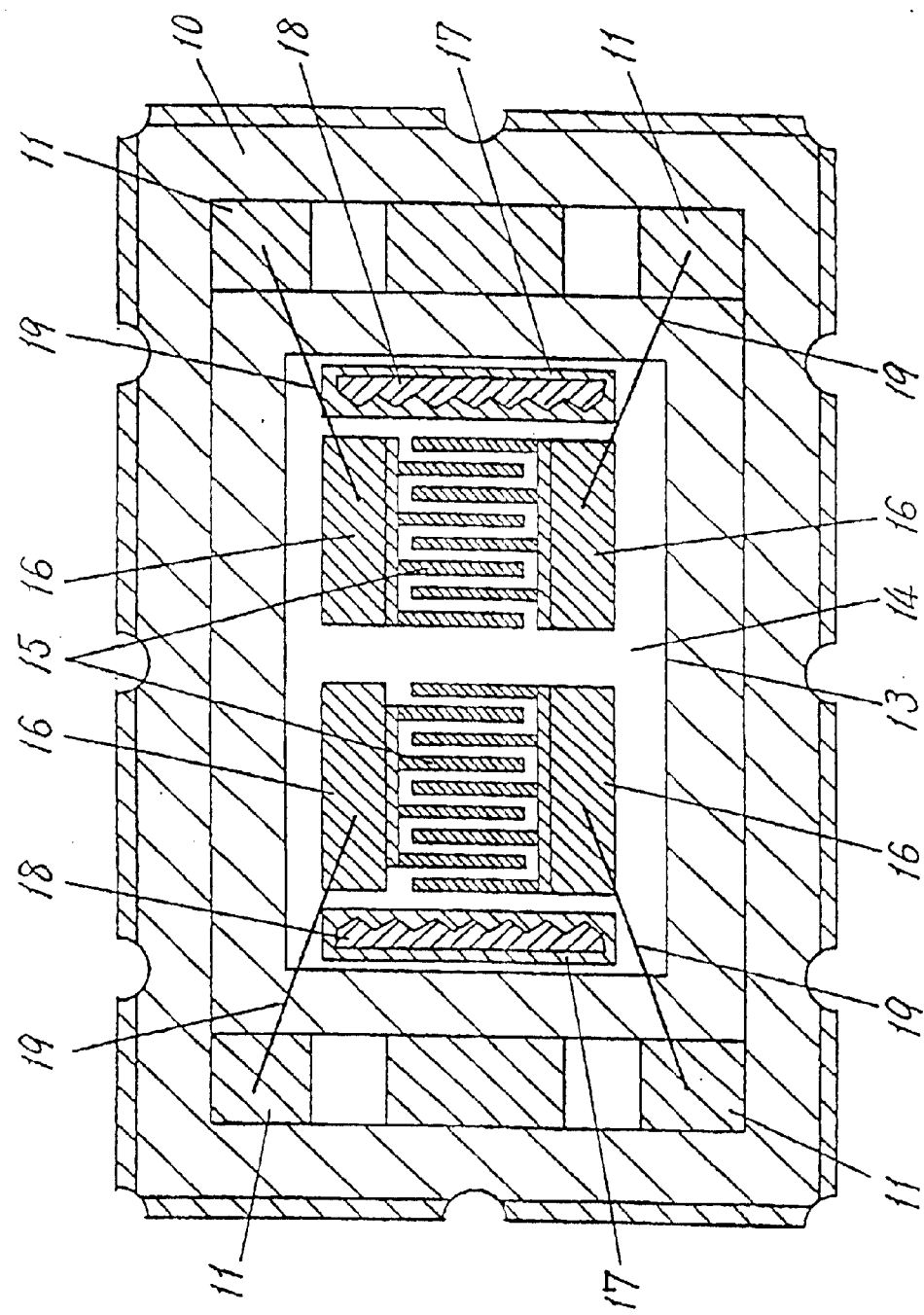
FIG. 2 is a top view of the SAW device before sealing with a lid in the first exemplary embodiment of the present invention.
Figure 3:
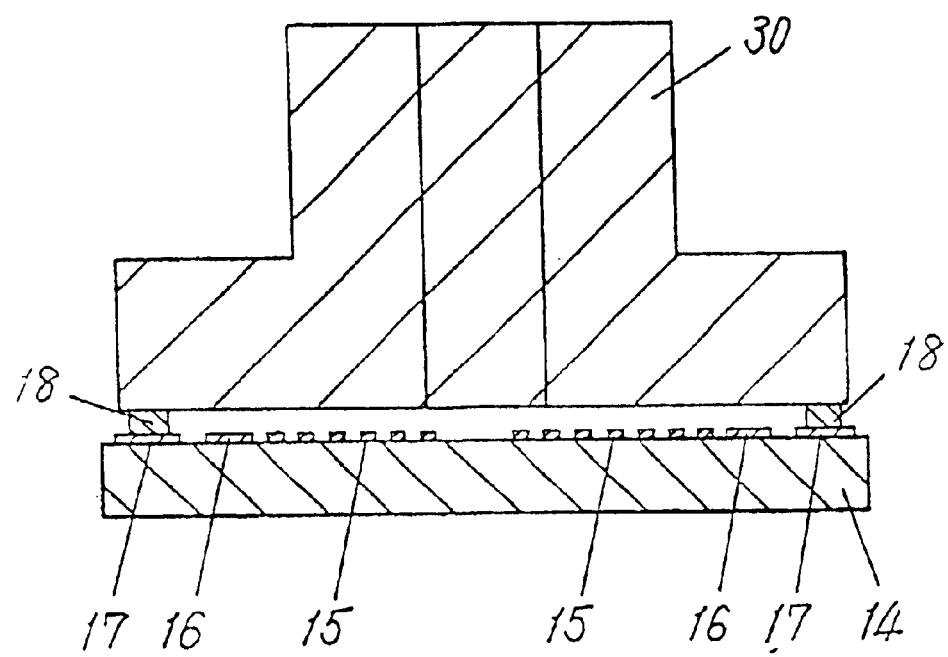
FIG. 3 is a cross-sectional view to illustrate manufacturing process of the SAW device in the first exemplary embodiment of the present invention.

First Exemplary Embodiment:

Referring to FIGS. 1 to 3, a description will be given on a first exemplary embodiment of the present invention.

A uniform thickness vapor deposited film composed of aluminum or a metal having aluminum as the main constituent is formed on the main surface of a wafer composed of a piezoelectric material such as quartz, $LiTaO_3$, $LiNbO_3$, and the like. Positive type photoresist is then uniformly coated by spin coating on top of the vapor deposited film. Next, the photoresist is exposed and developed so as to make IDT electrodes 15 having a desired shape, connection electrodes 16 to be connected to the IDT electrodes 15, and underlying metal layers 17 to be disposed at the locations where acoustic absorbers are to be formed, and then the vapor deposited film is etched to obtain IDT electrodes 15, connection electrodes 16, and underlying metal layers 17, and the photoresist is removed. Here, the underlying metal layers 17 are formed to a size greater than the acoustic absorbers to be formed.

Subsequently, the entire main surface of the wafer whereon the IDT electrodes 15 have been formed is covered with a negative photoresist film, which is then pressed while being heated. The exposed portion of the film resist is to become acoustic absorbers 18 and a film resist having the same thickness as that of the acoustic absorbers 18 are used.

Subsequently, acoustic absorbers 18 are formed by exposing and developing the portion which will form the acoustic absorbers 18 in a manner such that the film resist of that portion will remain. After development, moisture in the acoustic absorbers 18 is removed so as to improve adhesion with the piezoelectric substrate 14. When moisture is remaining in the acoustic absorbers 18, there is a possibility of causing a change in the quality of the acoustic absorbers 18 or corrosion of the IDT electrodes 15. A plurality of SAW elements 13 are formed on the wafer in this manner.

Next, the wafer is cut into individual SAW elements 13 with a dicer while spraying with water. After removing moisture, a SAW element 13 is transferred by sucking its surface, that is, the surfaces of the acoustic absorbers 18 with a vacuum chuck 30 shown in FIG. 3, and is mounted in a package 10 coated with an adhesive 12. During this process, as the acoustic absorbers 18 have the same thickness and, in addition, as their top surfaces are formed parallel to the surface of the substrate 14, the SAW element 13 can be securely sucked with the vacuum chuck 30 and can be accurately mounted in the package 10.

Next, as illustrated in FIG. 2, the connection electrodes 16 of the SAW element 13 and the external terminals 11 of the package 10 are electrically connected with thin metal wires 19, the opening of the package 10 is sealed with a lid 20, and a SAW device shown in FIG. 1 is obtained.

Figure 4:
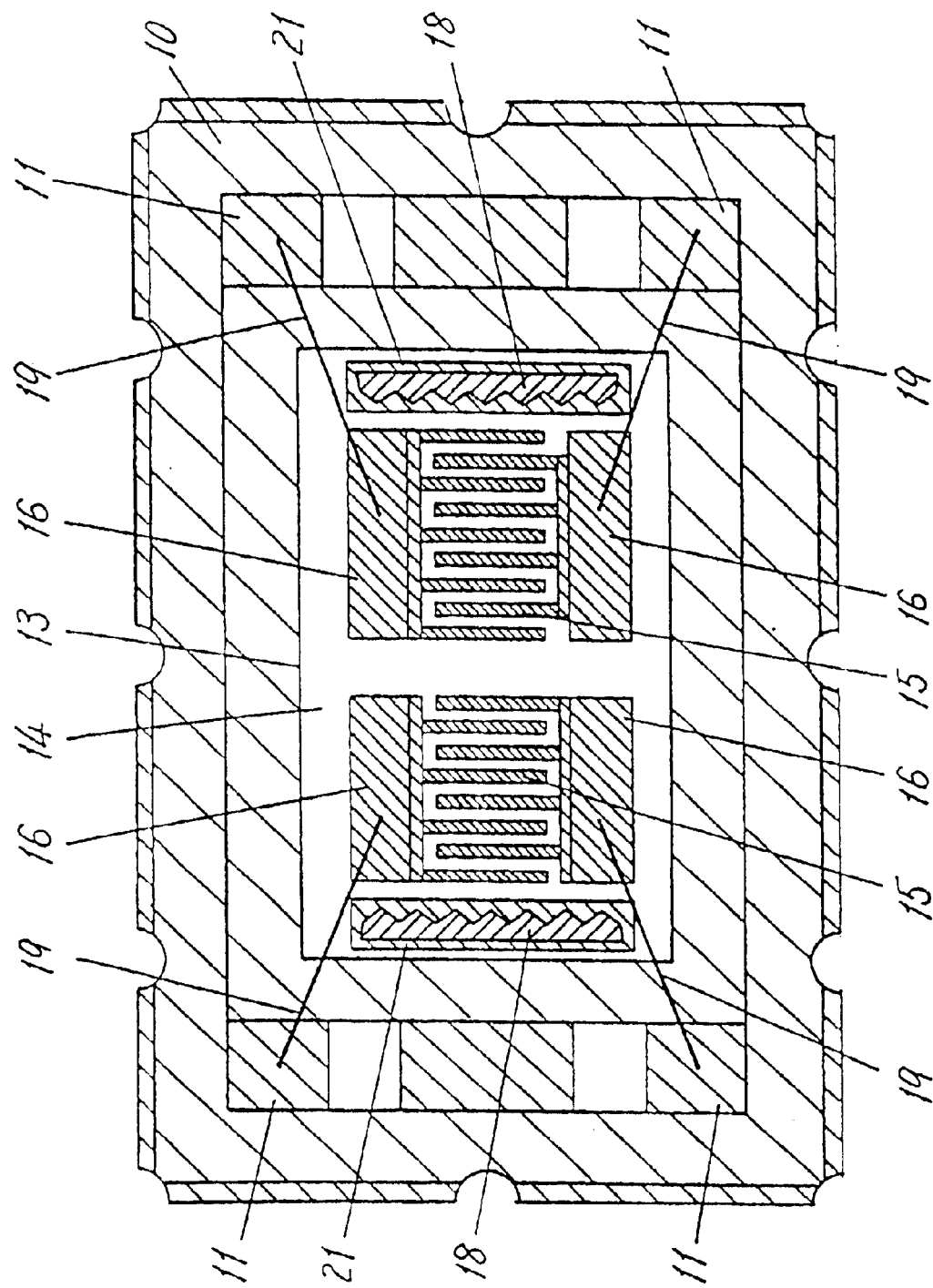
FIG. 4 is a top view of a SAW device before sealing with a lid in a second exemplary embodiment of the present invention.
Figure 5:
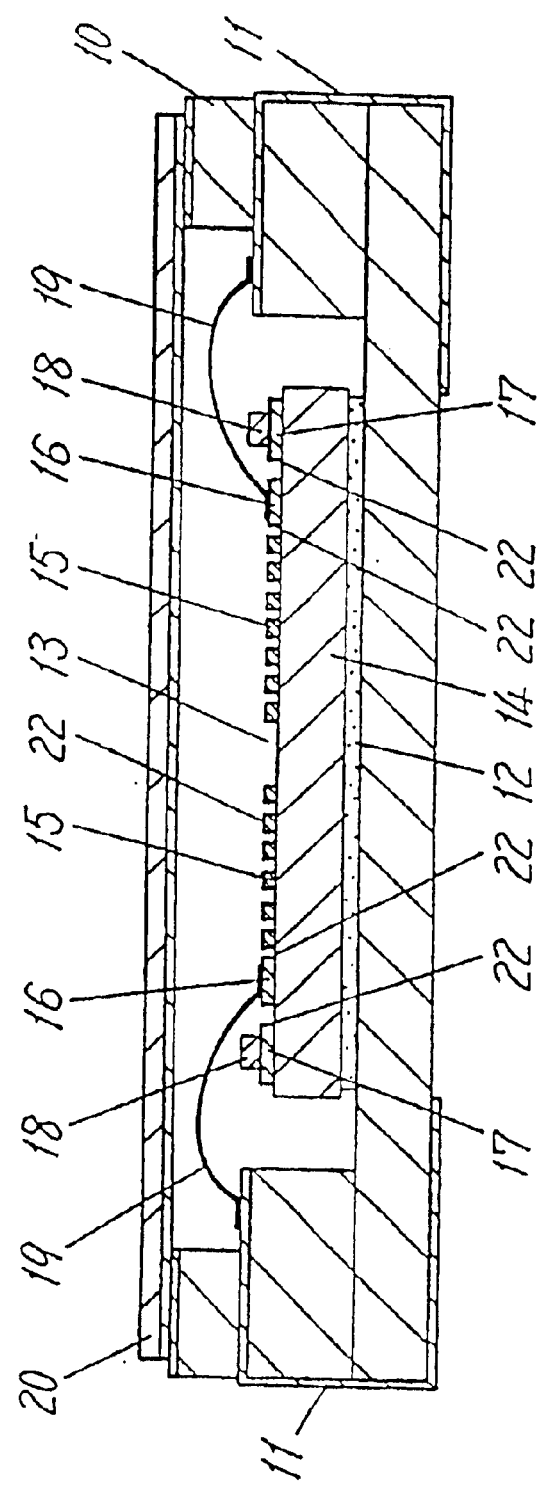
FIG. 5 is a cross-sectional view of the SAW device in the second exemplary embodiment of the present invention.

Second Exemplary Embodiment:

Referring to FIGS. 4 and 5, a description will be given on a second exemplary embodiment of the present invention.

First, a plurality of SAW elements 13 having IDT electrodes 15, connection electrodes 16, and underlying metal layers 17 are formed on a wafer in a manner similar to the first exemplary embodiment. Next, a coupling layer 21 is formed by uniformly spin coating a silane-based underlying coupling agent over the entire surface on the side of the wafer where the IDT electrodes 15 have been formed. Subsequently, solvent component in the coupling layer 21 is removed by drying.

Afterwards, as in the first exemplary embodiment, the entire main surface of the wafer is covered with a negative photoresist film, which is then pressed while being heated. As the film resist, one having the same thickness as the thickness of the acoustic absorbers 18 to be formed is used. Next, that portion of the film resist which will form the acoustic absorber 18 is exposed and developed. After acoustic absorbers 18 have been formed, moisture in the acoustic absorbers 18 is removed. Next, after dicing the wafer into individual SAW elements 13 as in the first exemplary embodiment, a SAW element 13 is mounted in a package 10 and a SAW device as illustrated in FIGS. 4 and 5 is obtained.

In this exemplary embodiment, too, as in the first exemplary embodiment, the top surfaces of the acoustic absorbers 18 are formed parallel to the surface of the piezoelectric substrate 14 thus enabling secure suction of the SAW element 13 with the vacuum chuck 30 shown in FIG. 3 and mounting in the package 10.

Furthermore, as the silane-based coupling layer 21 formed in this exemplary embodiment has a large force of adhesion with the acoustic absorbers 18 and the piezoelectric substrate 14, and is extremely thin as it is a monomolecular layer, it enables to greatly enhance the adhesion strength between the acoustic absorbers 18 and the piezoelectric substrate 14 without affecting the sound absorbing effect. As a result, when dicing the wafer on which a plurality of SAW elements 13 have been formed into individual SAW elements 13, peeling off the acoustic absorbers 18 from the piezoelectric substrate 14 due to sprayed water can be prevented. In addition, acoustic absorbers 18 that are stronger to thermal stress and the like to be experienced while sealing opening of the package 10 with a lid 20 with solder, for example, or mounting a SAW device onto a circuit board by solder reflow method can be formed.

In the meantime, although only necessary parts of the coupling layer 21 are shown in FIGS. 4 and 5 for easy understanding, in this second exemplary embodiment, the coupling layer 21 is provided over the entire surface of the piezoelectric substrate 14 covering the IDT electrodes 15 and the connection electrodes 16.

Figure 6:
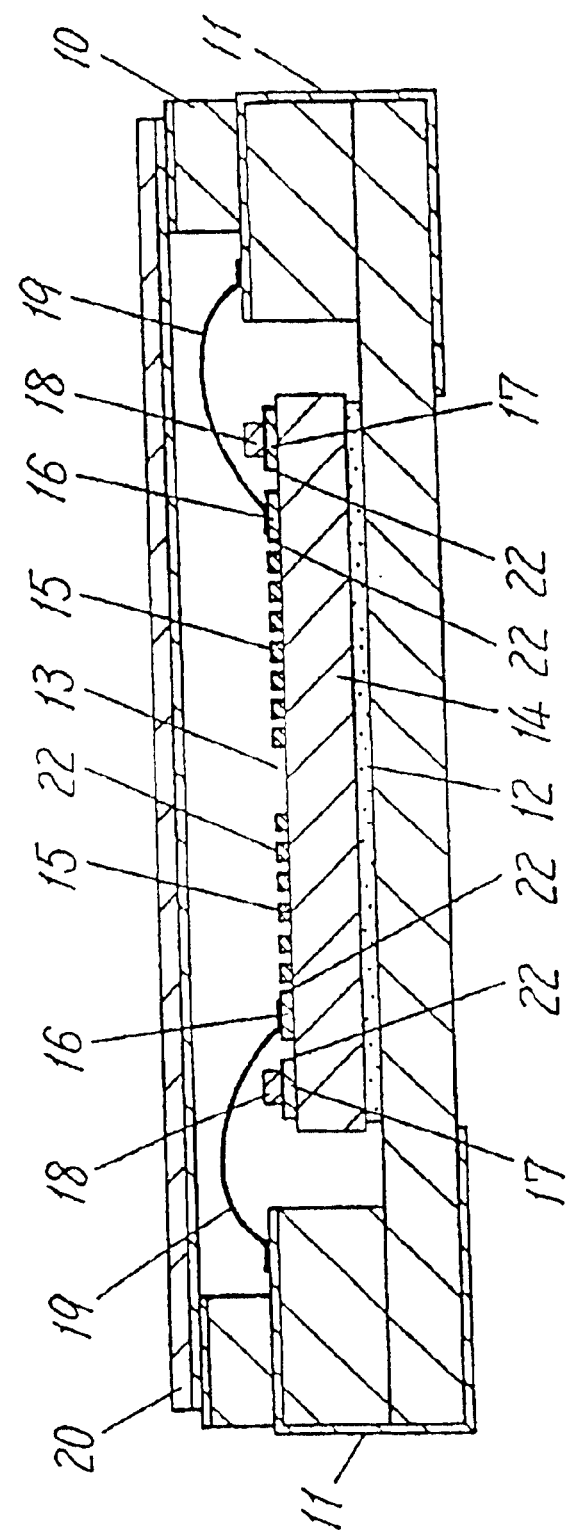
FIG. 6 is a cross-sectional view of a SAW device in a third exemplary embodiment of the present invention.
Figure 7:
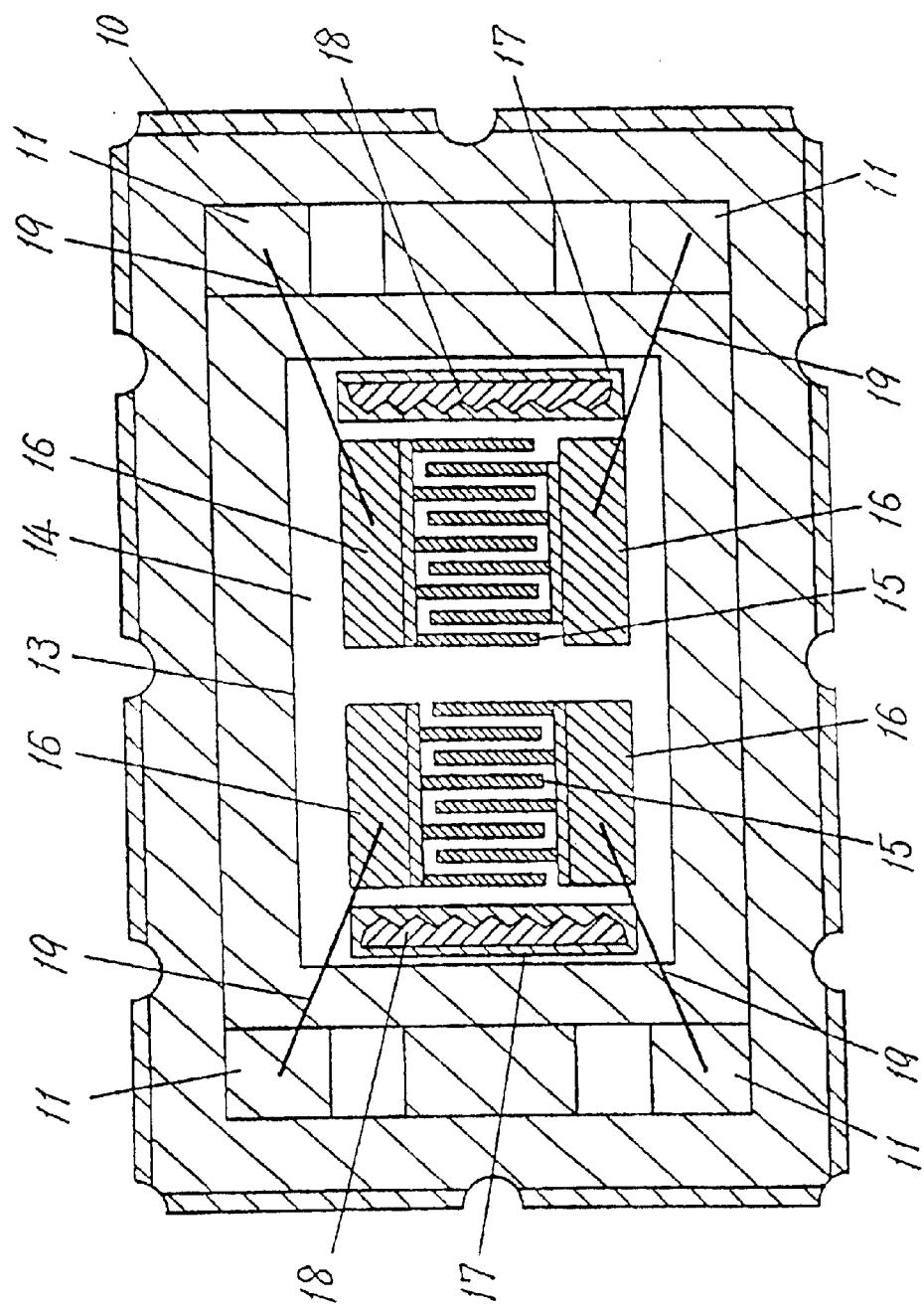
FIG. 7 is a top view of the SAW device before sealing with a lid in the third exemplary embodiment of the present invention.
Figure 8:
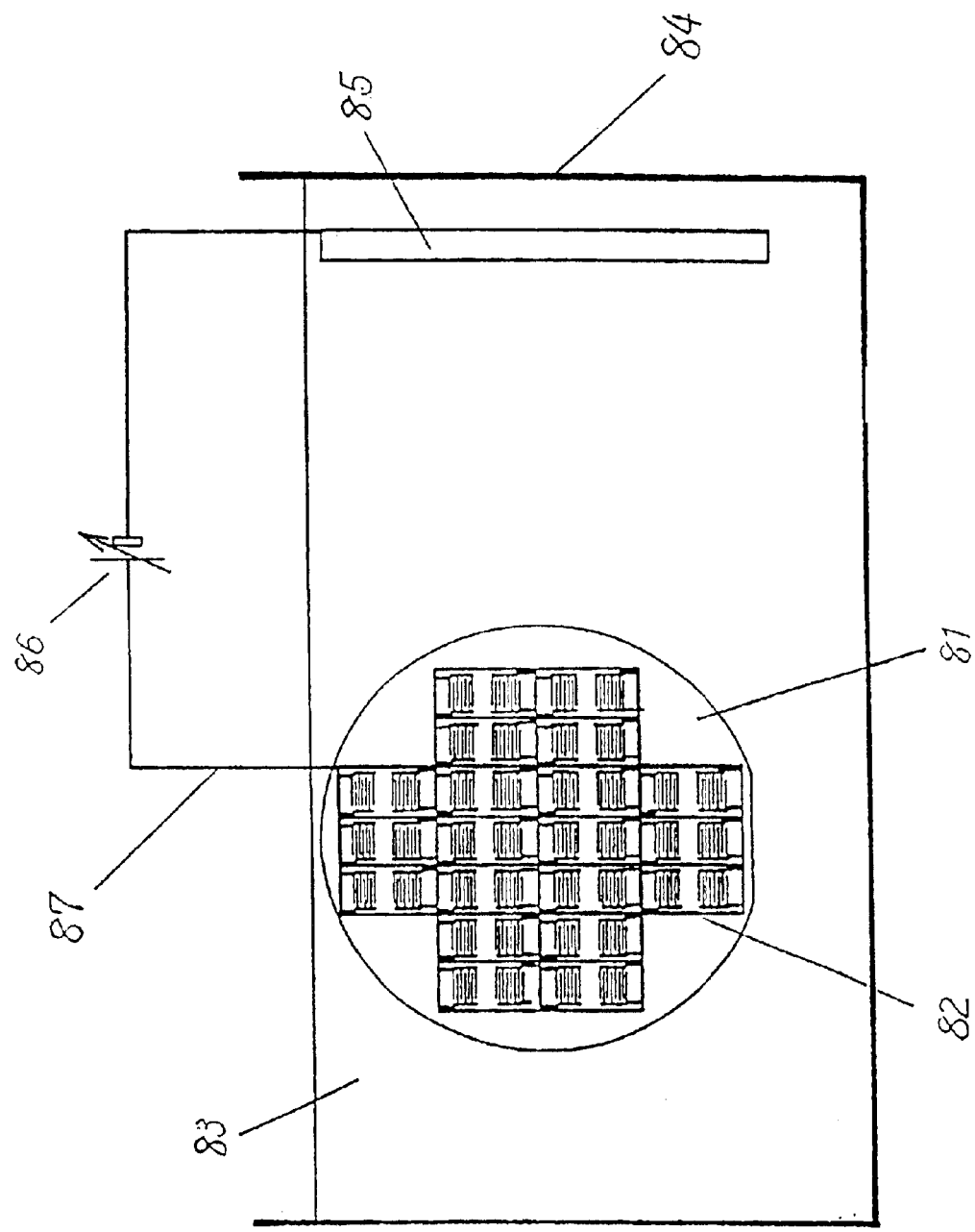
FIG. 8 is an illustrative diagram of the manufacturing process of the SAW device in the third exemplary embodiment of the present invention.

Third Exemplary Embodiment:

Referring to FIGS. 6, 7, and 8, a description will be given on a third exemplary embodiment of the present invention.

IDT electrodes 15, connection electrodes 16, and underlying metal layers 17 composed of aluminum film or aluminum alloy film are first formed on a wafer by photolithography in a manner similar to the first exemplary embodiment. Next, as illustrated in FIG. 8, a wafer 81 on which SAW elements 13 have been formed and an electrode 85 made of stainless steel and the like are immersed in a liquid electrolyte 83, and a voltage is applied or a current is supplied from a power supply 86 using the electrode 85 as the cathode and a current supplying wire 87 that collects leads 82 form the IDT electrodes 15, connection electrodes 16 and the underlying metal layers 17 as the anode. Here, the numeral 84 is a chemically resistant vessel. With this treatment, surfaces of the IDT electrodes 15, connection electrodes 16 and the metal layers 17 including respective sides are oxidized and are covered with a protective film 22 as shown in FIG. 6. Then, the wafer 81 is pulled out from the liquid electrolyte 83 and cleansed by dipping in pure water.

Next, the wafer 81 is diced into individual SAW elements 13 after forming a coupling layer 21 and acoustic absorbers 18 in a manner similar to the second exemplary embodiment.

Next, a SAW element 13 is mounted in a manner similar to the second exemplary embodiment in a package 10 coated with an adhesive 12, external terminals 11 and connection electrodes 16 are electrically connected with thin metal wires 19 as illustrated in FIG. 7, opening of the package 10 is sealed with a lid 20, and a SAW device shown in FIG. 6 is obtained.

In this exemplary embodiment, too, as in the first exemplary embodiment, the top surfaces of the acoustic absorbers 18 are formed parallel to the main surface of the piezoelectric substrate 14 thus enabling secure suction of the SAW element 13 with the vacuum chuck 30 shown in FIG. 3 and mounting in the package 10.

Furthermore, in this exemplary embodiment, too, the silane-based coupling layer 21 can greatly enhance the adhesion strength between the acoustic absorbers 18 and the piezoelectric substrate 14 without affecting the sound absorbing effect. As a result, peeling off the acoustic absorbers 18 from the piezoelectric substrate 14 when dicing the wafer into individual SAW elements 13 by spraying water can be prevented. In addition, acoustic absorbers 18 that are stronger to thermal stress and the like to be experienced when solder sealing an opening of the package 10 with a lid 20, for example, or mounting a SAW device on a circuit board by reflow and other methods can be obtained.

In this exemplary embodiment, anodic oxidation was carried out after forming the IDT electrodes 15 and connection electrodes 16. As the developing solution for photosensitive resin is generally alkaline, there is a possibility of the IDT electrodes 15 and connection electrodes 16 that consist of aluminum or a metal having aluminum as the main constituent being eroded when developing the film resist that will form the acoustic absorbers 18. However, by covering the surfaces including the sides of the IDT electrodes 15 and the connection electrodes 16 with a protective film 22 consisting of alkali resistant aluminum oxide as in this exemplary embodiment, each of the electrodes can be protected against adverse effect by the developing solution.

Also, as the protective film 22 is electrically insulating, short-circuit failure of electrodes can be prevented in the event an electrically conductive foreign object drops onto the SAW element 13.

In this exemplary embodiment, anodic oxidation was carried out after the IDT electrodes 15, connection electrodes 16 and underlying metal layers 17 had been formed; however, it does not matter if anodic oxidation of the surface of vapor deposited film having aluminum or aluminum alloy as the main constituent is carried out before forming the IDT electrodes 15, connection electrodes 16, and underlying metal layers 17, followed by formation of the IDT electrodes 15, the connection electrodes 16, and the underlying metal layers 17 thereby making their top surfaces covered with an insulating protective film. In this case, during the period of development for forming the IDT electrodes 15, the connection electrodes 16, and the underlying metal layers 17, at least surfaces of the IDT electrodes 15 and the connection electrodes 16 will not be eroded by alkaline developing solution. However, as the sides are not covered with the protective film 22, it is preferable to carry out anodic oxidation after forming the IDT electrodes 15 as in the above-mentioned exemplary embodiment in order to prevent erosion by the developing solution for forming the acoustic absorbers 18.

By carrying out anodic oxidation and covering the surface with a protective film 22 either before or after forming the IDT electrodes 15 in this way, an effect of preventing erosion of the IDT electrodes 15 and the connection electrodes 16 due to alkaline developing solution higher than by not forming a protective film 22 can be obtained.

Figure 9:
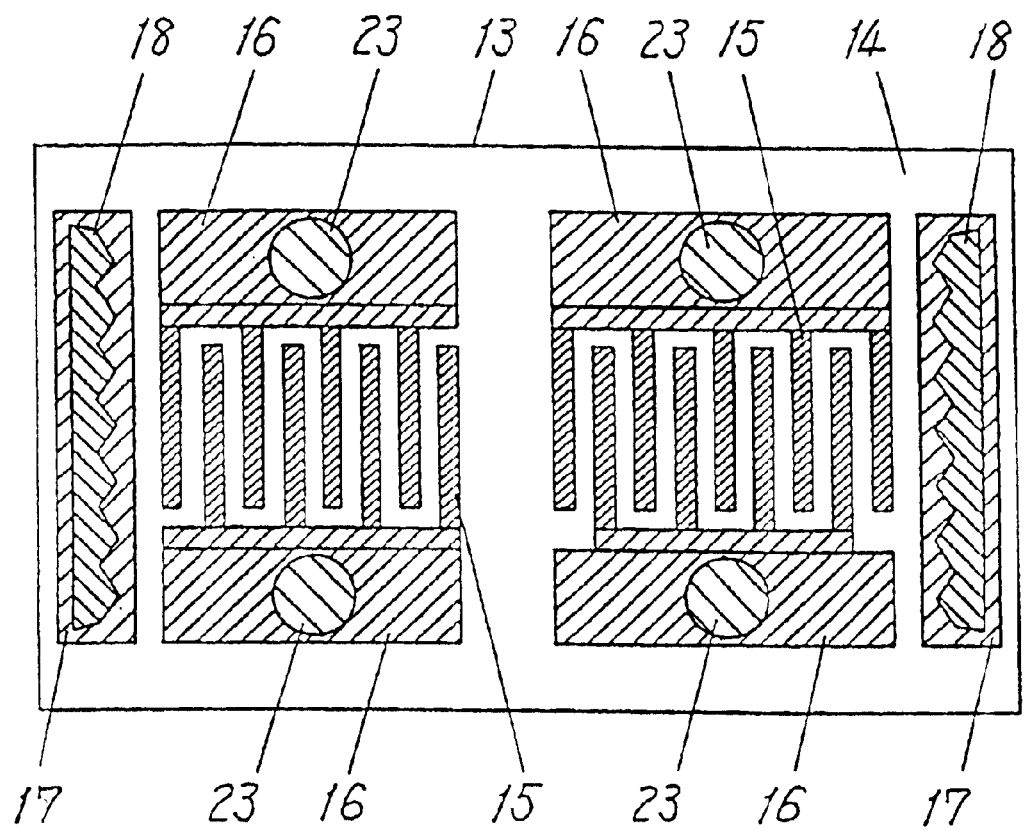
FIG. 9 is a top view of a SAW element in a fourth exemplary embodiment of the present invention.
Figure 10:
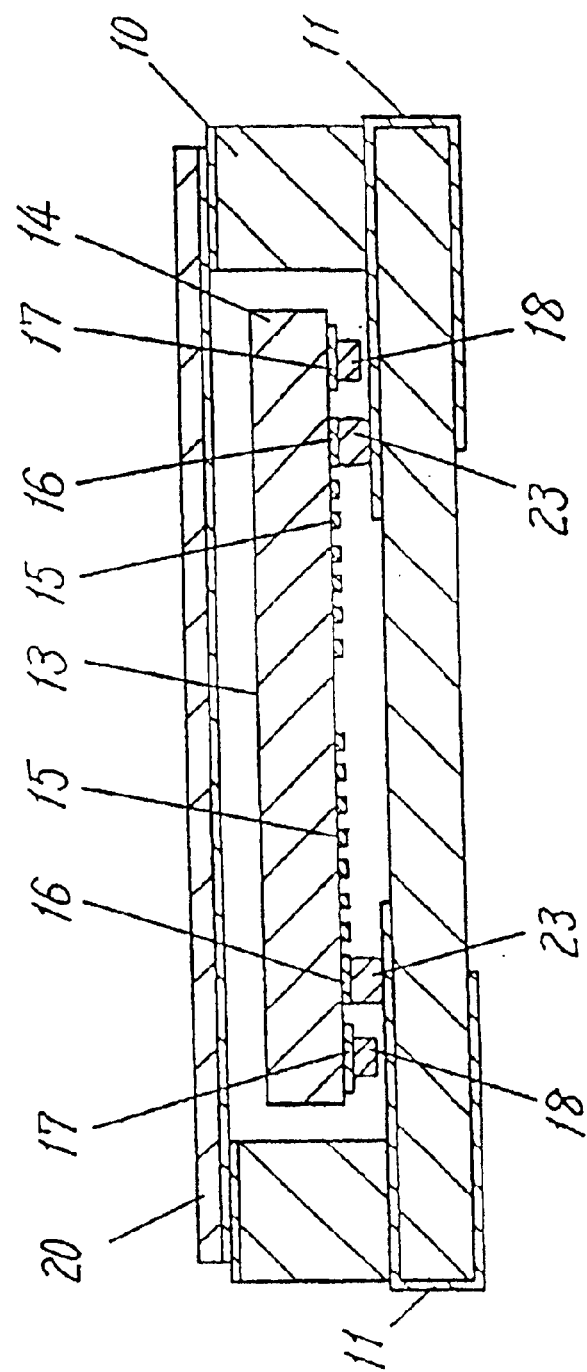
FIG. 10 is a cross-sectional view of a SAW device in the fourth exemplary embodiment of the present invention.
Figure 11:
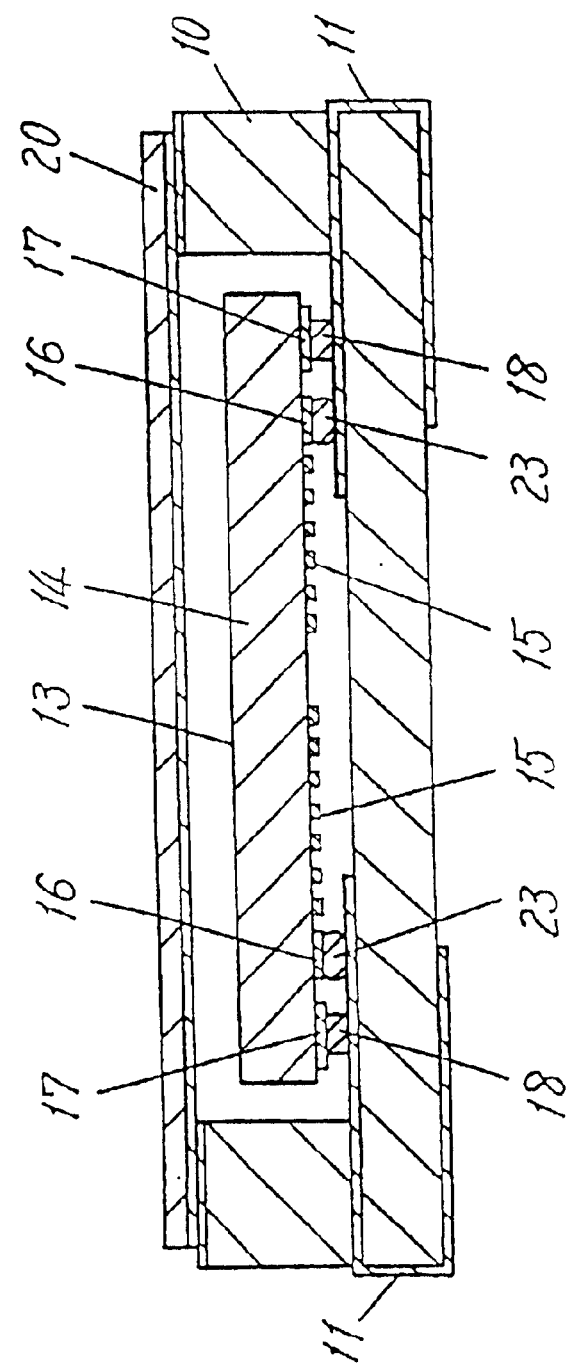
FIG. 11 is a cross-sectional view of a SAW device in the fourth exemplary embodiment of the present invention.

Fourth Exemplary Embodiment:

Referring to FIGS. 9, 10, and 11, a description will be given on a fourth exemplary embodiment of the present invention.

First, IDT electrodes 15, connection electrodes 16, and underlying metal layers 17 are formed on a wafer in a manner similar to the first exemplary embodiment followed by forming acoustic absorbers 18 on the underlying metal layers 17. The acoustic absorbers 18 have a height enough for forming a space necessary for the IDT electrodes 15 to excite surface acoustic waves (SAW) after being packaged in a package 10.

Next, gold bumps 23 are formed on the connection electrodes 16. The height of the bumps 23 is made higher than that of the acoustic absorbers 18.

Subsequently, the wafer is diced in the same way as in the first exemplary embodiment to obtain a SAW element 13 illustrated in FIG. 9.

The SAW element 13 is then mounted with the side having the bumps 23 facedown in the package 10 having external terminals 11, and the connection electrodes 16 of the SAW element 13 and the external terminals 11 are electrically connected through the bumps 23.

During this process, the height of the bumps 23 decreases due to heating and pressing.

Figure 24:
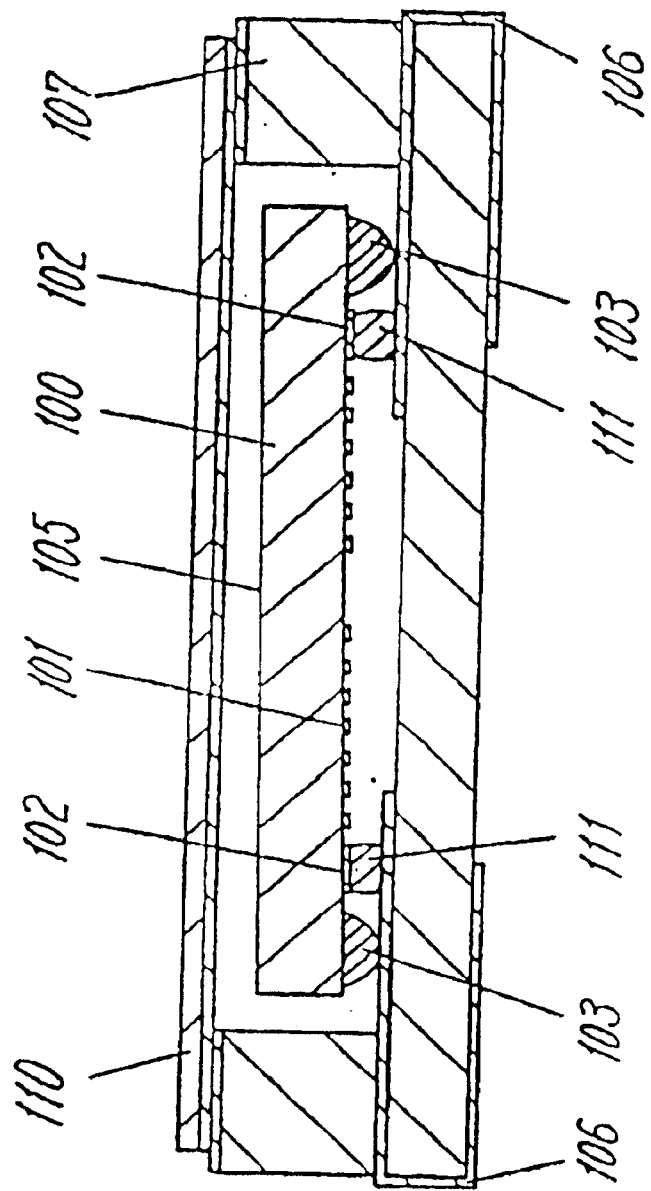
FIG. 24 is a cross-sectional view of a conventional SAW device.

In the case of conventional acoustic absorbers 103 shown in FIG. 24, as the height of each of the acoustic absorbers 103 differs and its cross section is domed, in connecting connection electrodes 102 of a SAW element 105 and external terminals 106 of a package 107 using bumps 111, there is a possibility of not being able to obtain a SAW device having desired characteristic since the SAW element 105 cannot be horizontally mounted in the package 107 when the height of bumps 111 has decreased to its minimum.

However, in this exemplary embodiment, as the heights of the acoustic absorbers 18 are fixed and their top surfaces are parallel to the piezoelectric substrate 14, in the event the height of bumps 23 has lowered as shown in FIG. 11 during the mounting process, the acoustic absorbers 18 work as stoppers and prevent the bumps 23 from becoming lower than the height of the acoustic absorbers 18 thereby enabling to secure enough space for the IDT electrodes 15 to excite SAW. Also, as the SAW element 13 can be horizontally mounted, the dispersion of joining strength between the bumps 23 and the connection electrodes 16 can be reduced. In other words, a SAW element 13 such as this is strong against mechanical and thermal stress.

Thereafter, opening of the package 10 is sealed with a lid 20 to obtain a SAW device as illustrated in FIG. 10.

While bumps 23 are formed with gold in this exemplary embodiment, they may be formed with solder and the like.

Figure 12:
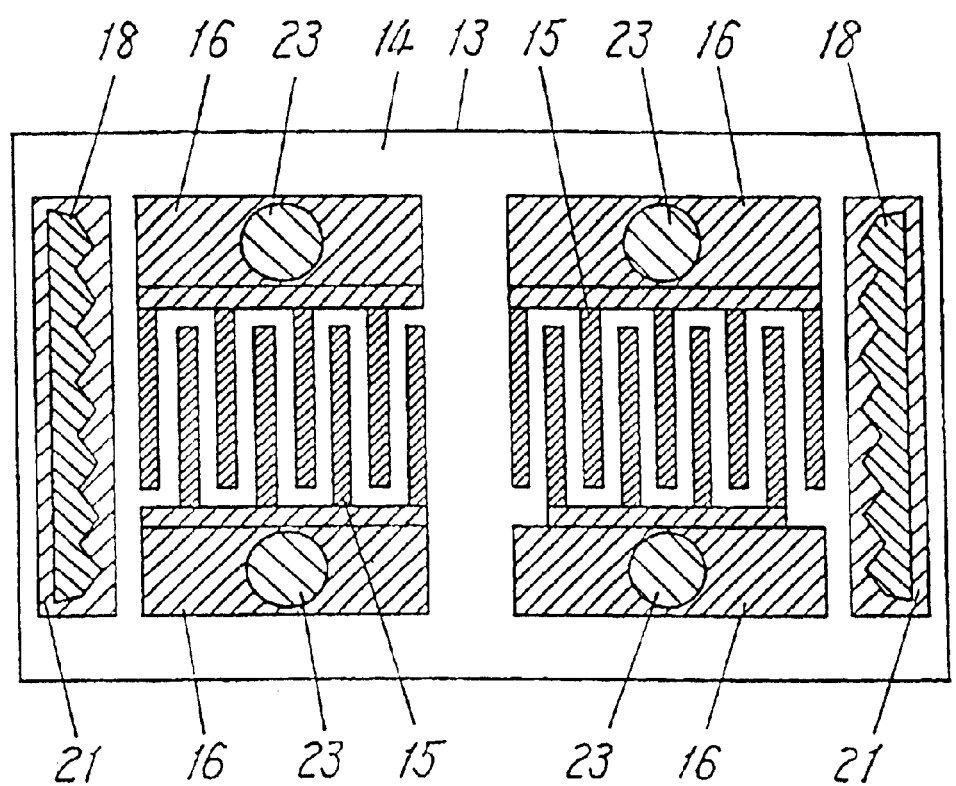
FIG. 12 is a top view of a SAW element in a fifth exemplary embodiment of the present invention.
Figure 13:
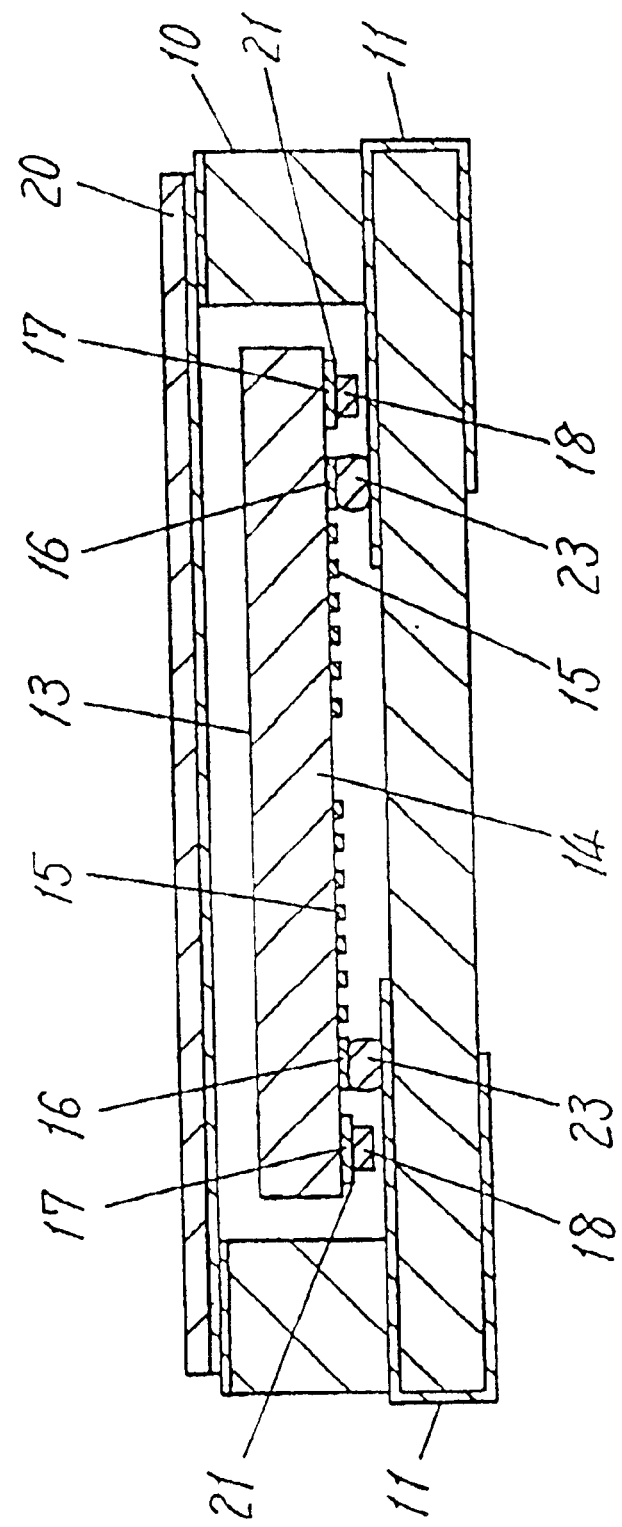
FIG. 13 is a cross-sectional view of a SAW device in the fifth exemplary embodiment of the present invention.

Fifth Exemplary Embodiment:

Referring to FIGS. 12 and 13, a description will be given on a fifth exemplary embodiment of the present invention.

First, IDT electrodes 15, connection electrodes 16, underlying metal layers 17, and coupling layers 21 are formed on a wafer in a manner similar to the second exemplary embodiment.

Next, the entire surface of the wafer is covered with a negative photosensitive film resist and heated, and the film resist is pressed. As the film resist, one having the same thickness as that of the acoustic absorbers 18 to be formed is used. Next, the film resist is exposed and developed in a manner such that the portion of the film resist forming the acoustic absorbers 18 will remain and the acoustic absorbers 18 are obtained. The acoustic absorbers 18 have a height enough for the IDT electrodes 15 to form a space necessary for exciting SAW after being mounted in a package 10.

Next, the wafer is diced into individual SAW elements 13 as shown in FIG. 12 after forming bumps 23 on the connection electrodes 16 in a manner similar to the fourth exemplary embodiment, mounted in a package 10, and a SAW device as shown in FIG. 13 is obtained.

In this exemplary embodiment, too, as in the fourth exemplary embodiment, as the acoustic absorbers 18 work as stoppers at the time the SAW element 13 is being mounted, the height of the bumps 23 will not become lower than the height of the acoustic absorbers 18 and a space necessary for the IDT electrodes 15 to excite SAW can be secured. Also, during this process, as the SAW element 13 can be horizontally mounted, the dispersion of adhesion strength between the bumps 23 and the connection electrodes 16 can be reduced. In other words, a SAW device such as this is strong against mechanical and thermal stress.

Furthermore, in this exemplary embodiment, as in the second exemplary embodiment, by forming a coupling layer 21 between the underlying metal layers 17 and the acoustic absorbers 18, the adhesion strength between the acoustic absorbers 18 and the piezoelectric substrate 14 can be greatly enhanced without affecting the sound absorbing effect. As a result, peeling off the acoustic absorbers 18 from the piezoelectric substrate 14 by spraying water when dicing the wafer into individual SAW elements 13 can be prevented. In addition, acoustic absorbers 18 that are stronger to stress such as thermal stress to be experienced while solder sealing opening of the package 10 with a lid 20, for example, or mounting a SAW device on a circuit board by reflow and other methods can be provided.

Although only necessary parts of the coupling layer 21 are shown in FIGS. 12 and 13 for ease of understanding, in this exemplary embodiment the coupling layer 21 is provided over the entire surface of the piezoelectric substrate 14 covering the IDT electrodes 15 and the connection electrodes 16.

Figure 14:
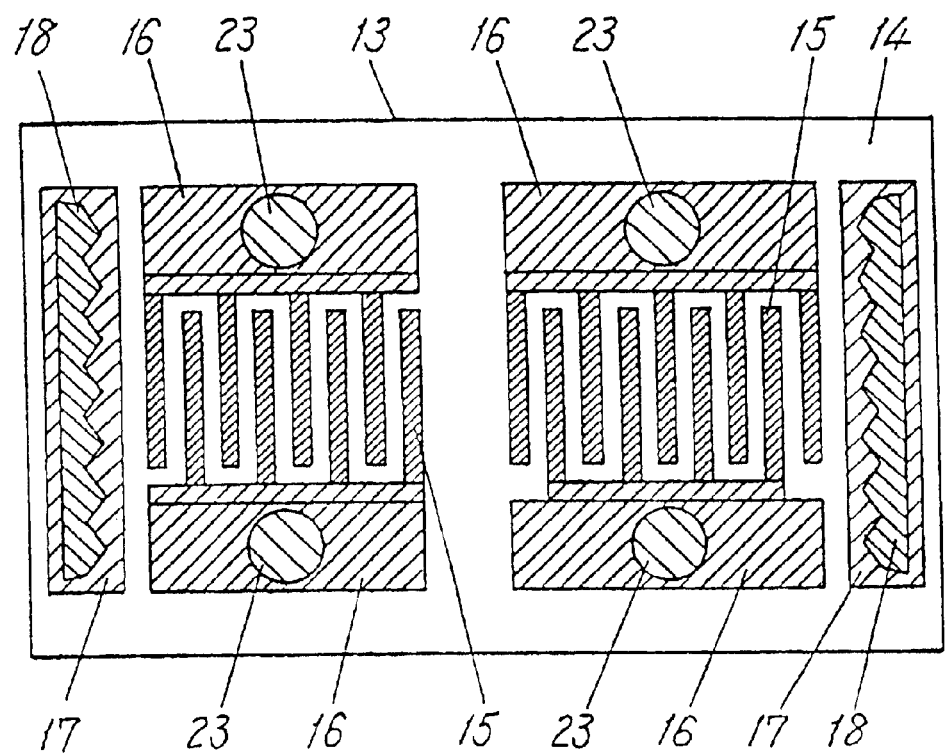
FIG. 14 is a top view of a SAW element in a sixth exemplary embodiment of the present invention.
Figure 15:
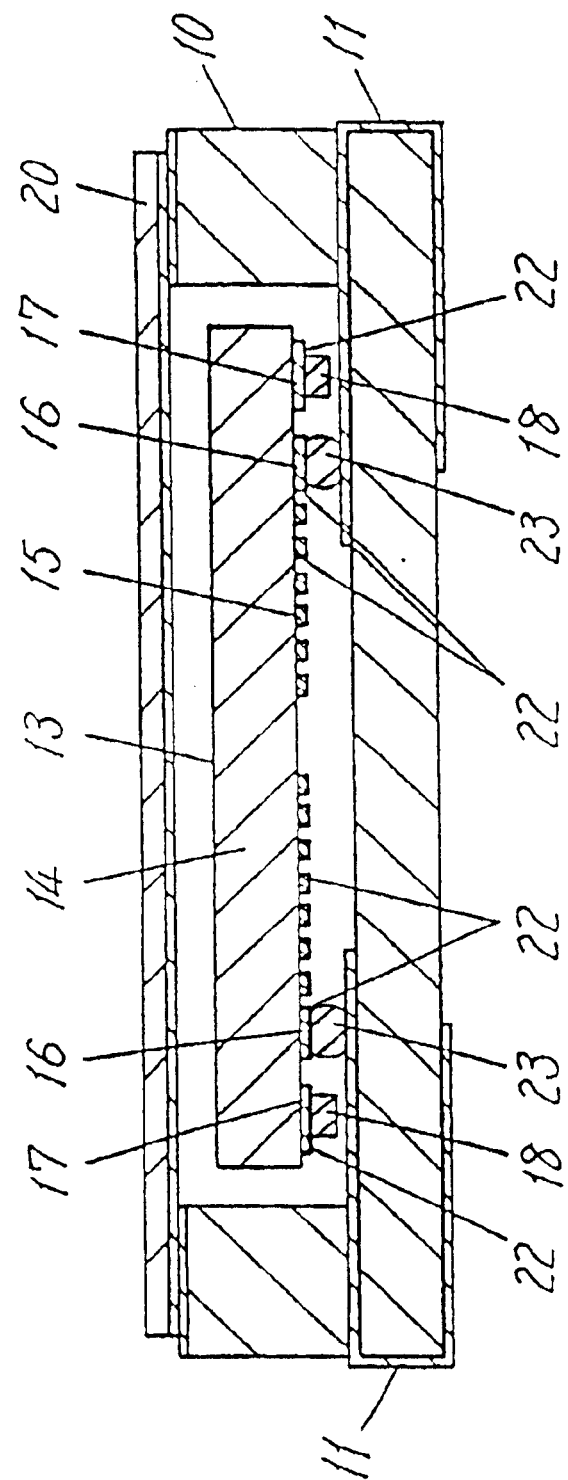
FIG. 15 is a cross-sectional view of a SAW device in the sixth exemplary embodiment of the present invention.

Sixth Exemplary Embodiment:

Referring to FIGS. 14 and 15, a description will be given on a sixth exemplary embodiment of the present invention.

First, IDT electrodes 15, connection electrodes 16, and underlying metal layers 17 of which the surfaces and the sides have been covered with an insulating protective film 22 are formed in a manner similar to the third exemplary embodiment.

Going through the same subsequent processes as in the fourth and fifth exemplary embodiments, acoustic absorbers 18 are formed on the underlying metal layers 17. After further forming bumps 23 on the connection electrodes 16, wafer is diced into individual SAW elements 13 shown in FIG. 14. Next, a SAW device as shown in FIG. 15 is fabricated by mounting a SAW element 13 in a package 10 and sealing with a lid 20.

In this exemplary embodiment, as in the third exemplary embodiment, since the surfaces and sides of the IDT electrodes 15, connection electrodes 16, and underlying metal layers 17 are covered with a protective film 22, erosion of the IDT electrodes 15 and the connection electrodes 16 by alkaline liquid electrolyte during development for the formation of the acoustic absorbers 18 can be prevented.

Also, as described in the third exemplary embodiment, the electrically insulating protective film 22 may be formed on the surfaces of the IDT electrodes 15 and the connection electrodes 16 by carrying out anodic oxidation after a metal film of aluminum or aluminum alloy has been formed on the wafer prior to the formation of the IDT electrodes 15, connection electrodes 16, and underlying metal layers 17.

Figure 16:
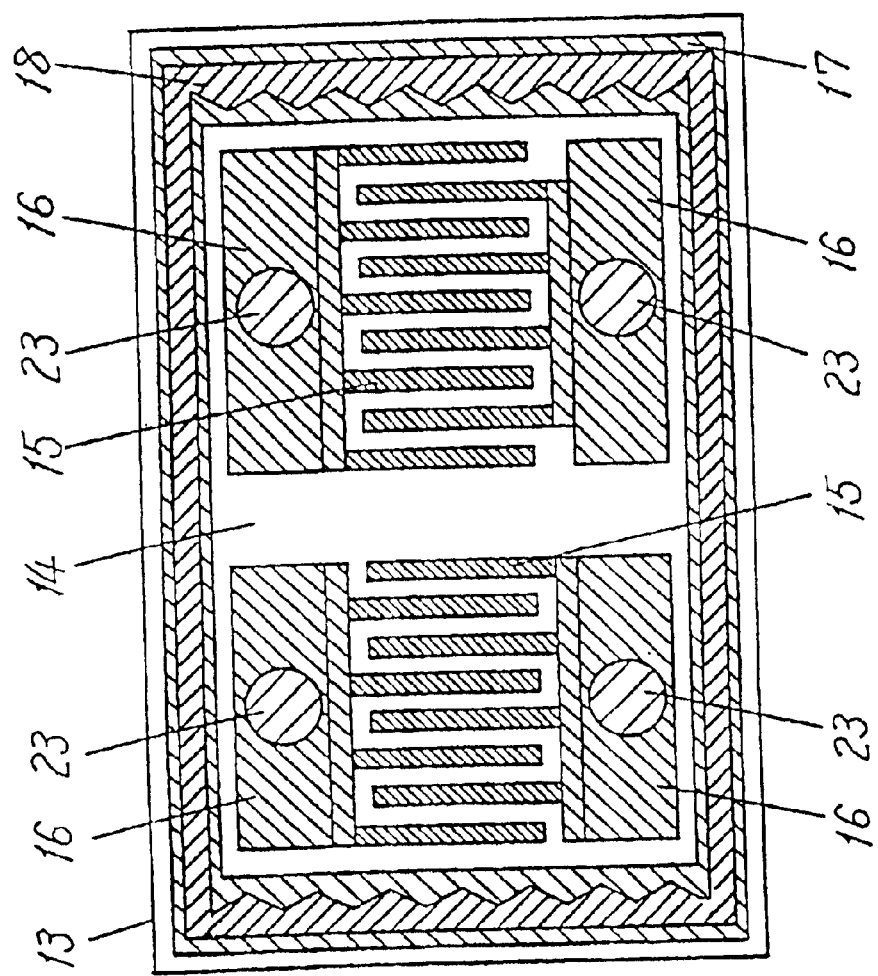
FIG. 16 is a top view of a SAW element in a seventh exemplary embodiment of the present invention.
Figure 17:
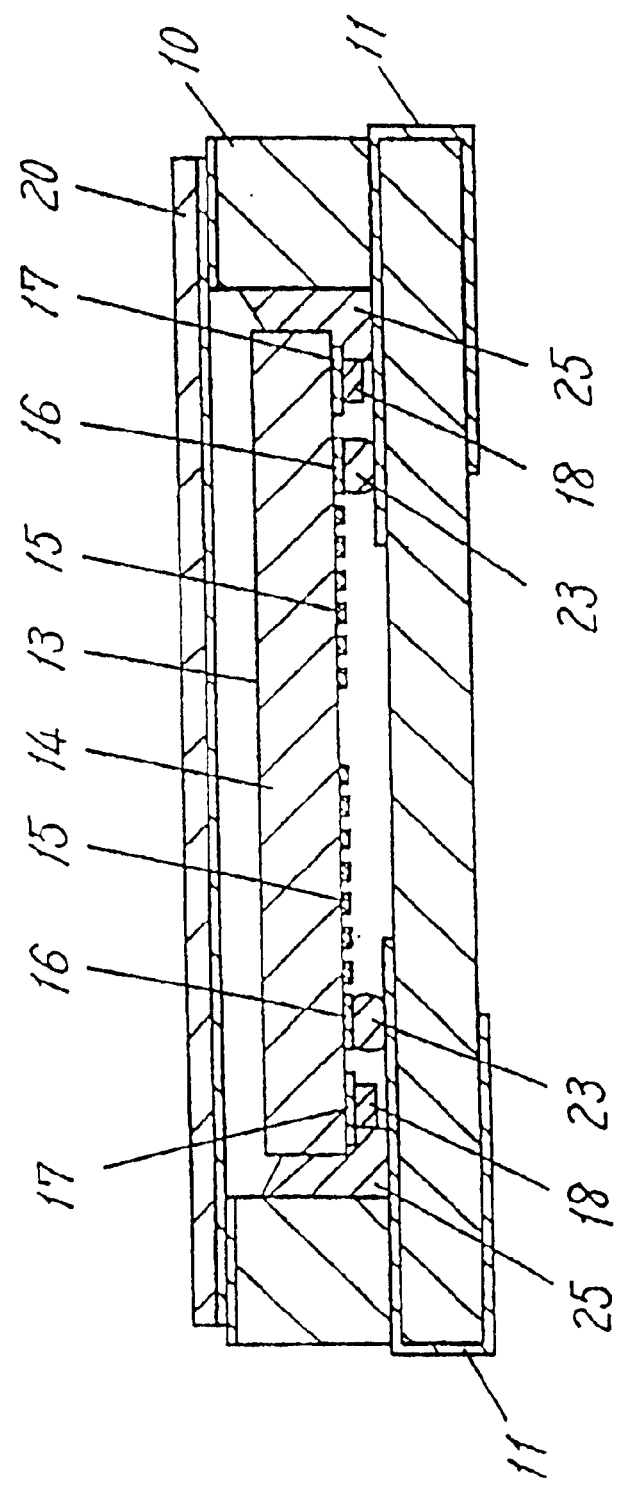
FIG. 17 is a cross-sectional view of a SAW device in the seventh exemplary embodiment of the present invention.

Seventh Exemplary Embodiment:

Referring to FIGS. 16 and 17, a description will be given on a seventh exemplary embodiment of the present invention. In this exemplary embodiment, only the difference from the SAW device of the fourth exemplary embodiment will be described.

In this exemplary embodiment, as shown in FIG. 16, underlying metal layers 17 and acoustic absorber 18 to be formed thereon are formed in the shape of a frame on the periphery of a piezoelectric substrate 14 in a manner such that they surround IDT electrodes 15 and connection electrodes 16. The method of formation is the same as in the fourth exemplary embodiment.

After a SAW element 13 has been mounted in a package 10, a filler 25 composed of a silicone-based resin is filled between the SAW element 13 and the inner wall of the package 10 and then cured by heating. During this process, the frame-shaped acoustic absorber 18 prevents the filler 25 from flowing into the SAW excitation space of the IDT electrodes 15.

In addition, the filler 25 has, after being cured, a higher elasticity than the acoustic absorber 18 and can absorb spurious waves that have not been absorbed by the acoustic absorber 18 and can also relieve the stress applied to the SAW element 13 due to the difference in thermal expansion coefficients between those of the SAW element 13 and the package 10 thus preventing change of characteristics.

Figure 18:
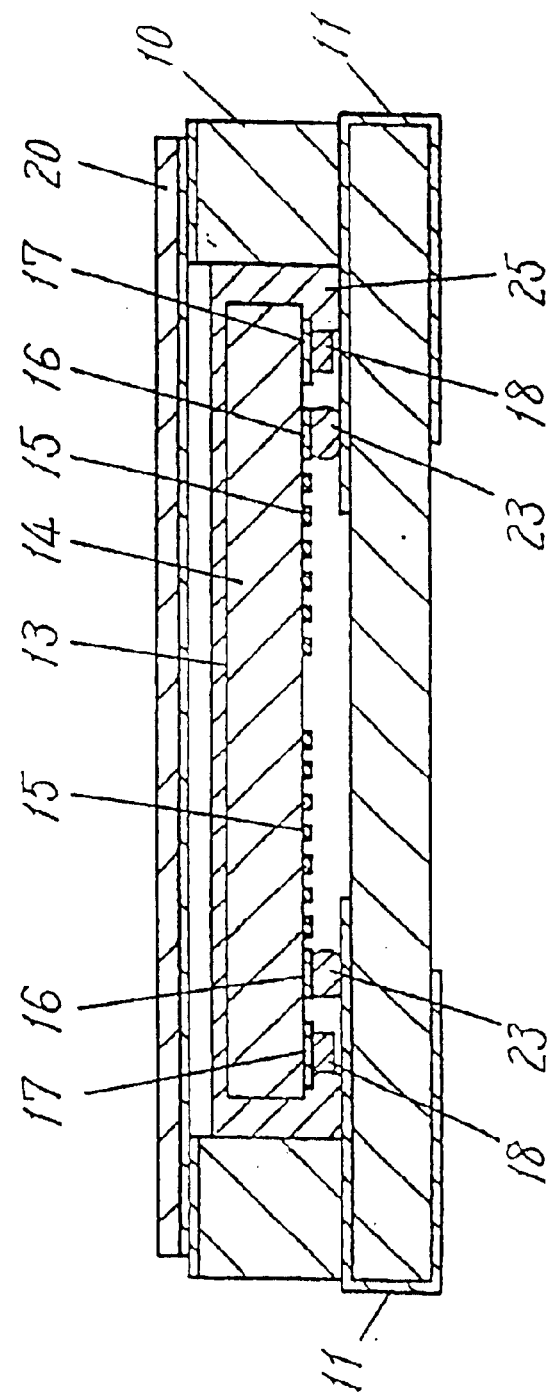
FIG. 18 is a cross-sectional view of a SAW device in an eighth exemplary embodiment of the present invention.

Eighth Exemplary Embodiment:

Referring to FIG. 18, a description will be given on an eighth exemplary embodiment of the present invention.

The difference of a SAW device of this exemplary embodiment from the SAW device of the seventh exemplary embodiment lies in that a filler 25 is provided not only between the SAW element 13 and the inner wall of the package 10 but also on the rear surface of the SAW element 13 facing a lid 20. Other structure is the same. As a result, a further higher effect of absorbing spurious waves is obtained compared with that of the SAW device of the seventh exemplary embodiment.

While the filler 25 is provided in this exemplary embodiment over the entire rear surface of the SAW element 13 facing the lid 20, similar effect of absorbing spurious waves is obtainable by providing only on the portions corresponding to the IDT electrodes 15.

Also, when sealing the package 10 with the lid 20, it is preferable that care be taken not to make the filler 25 provided on the rear surface of the SAW element 13 facing the lid 20 and the lid 20 come in contact with each other in order to prevent deterioration of the characteristics caused by deformation of the SAW element 13 due to an excessive pressure applied from the rear surface of the SAW element 13.

Figure 19:
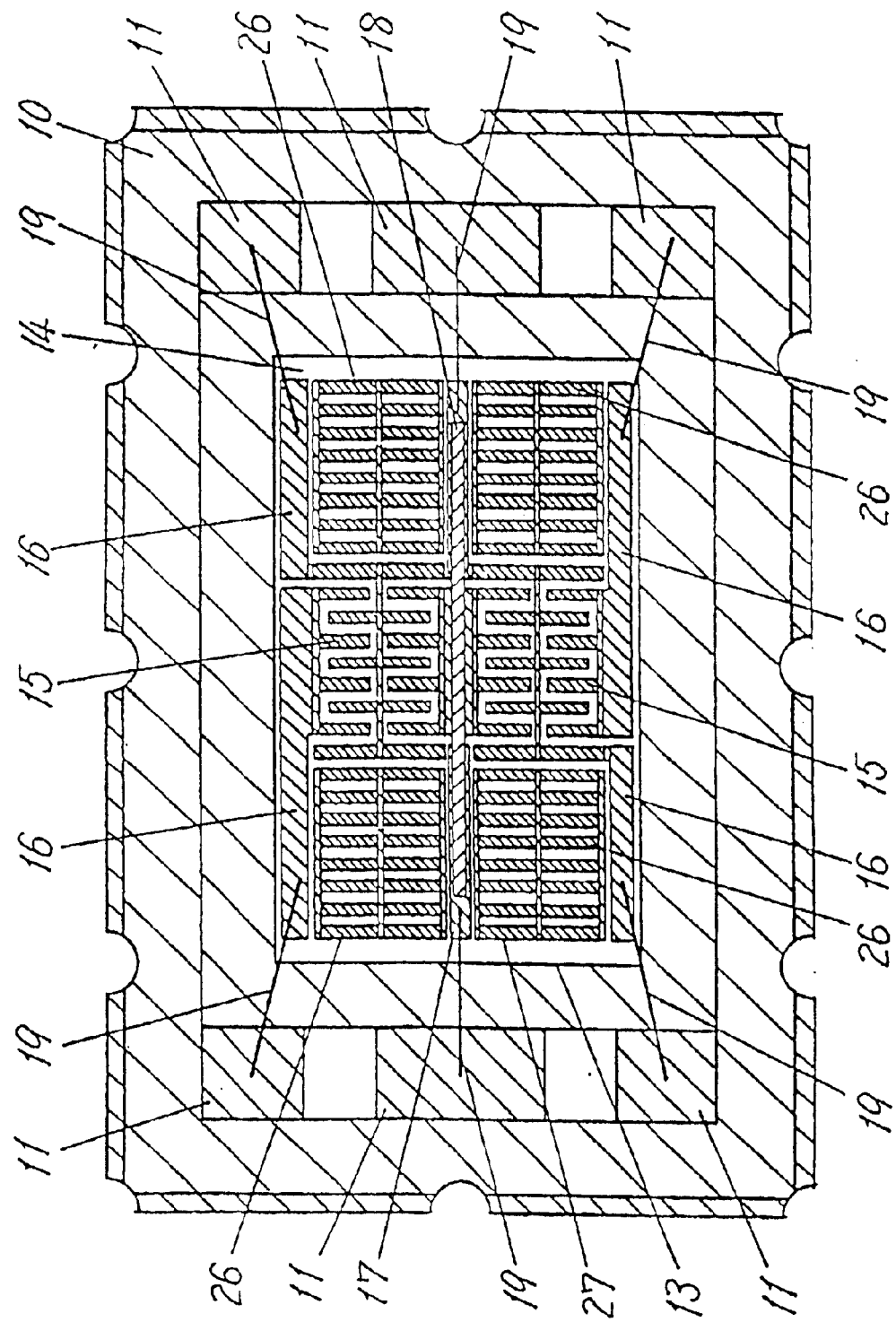
FIG. 19 is a top view of a SAW device before sealing with a lid in a ninth exemplary embodiment of the present invention.

Ninth Exemplary Embodiment:

Referring to FIG. 19, a description will be given on a ninth exemplary embodiment of the present invention.

In this exemplary embodiment, as illustrated in FIG. 19, two pairs of IDT electrodes 15 are integrated into one unit, two surface acoustic wave units (SAW units) 27 provided with reflector electrodes 26 on both sides of them are provided in parallel on a piezoelectric substrate 14, and an acoustic absorber 18 is formed on the piezoelectric substrate 14 between the SAW units 27 with intervention of an underlying metal layer 17. By employing this structure, acoustic coupling between the two SAW units 27 can be suppressed, providing a superior quantity of out-of-band attenuation.

As the acoustic absorber 18 is made by the method described in the first exemplary embodiment and the top surface is parallel to the surface of the piezoelectric substrate 14, it enables mounting of a SAW element 13 in a package 10 by securely sucking the SAW element 13 with a vacuum chuck 30 shown in FIG. 3.

In a SAW device having a plurality of SAW units 27 on a single piezoelectric substrate 14, it is preferable to provide an acoustic absorber 18 at least between opposing IDT electrodes 15 between the two SAW units 27 and suppress acoustic coupling. Also, in the SAW units 27, when reflector electrodes 26 are provided between the IDT electrodes 15 or at both ends of the IDT electrodes 15, it is preferable to provide an acoustic absorber 18 fabricated by a similar method not only between the IDT electrodes 15 between the SAW units 27 as described above but also between the reflector electrodes 26.

Figure 20:
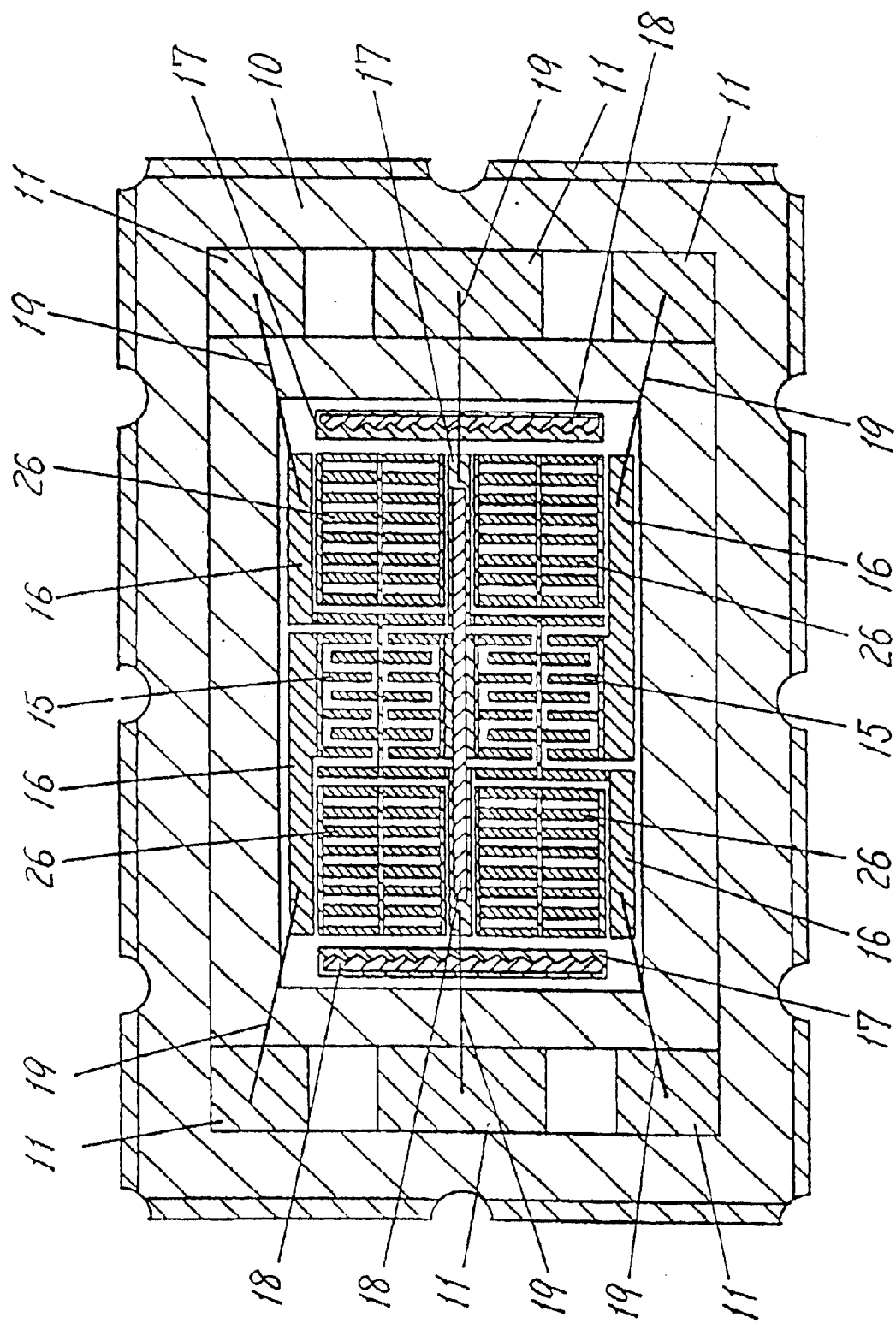
FIG. 20 is a top view of a SAW device before sealing with a lid in a tenth exemplary embodiment of the present invention.

Tenth Exemplary Embodiment:

Referring to FIG. 20, a description will be given on a tenth exemplary embodiment of the present invention.

In this exemplary embodiment, acoustic absorbers 18 are provided not only between two SAW units 27 but also between reflector electrodes 26 and the end of a piezoelectric substrate 14 in the direction of propagation of SAW as illustrated in FIG. 20. Needless to say, the acoustic absorbers 18 are provided on the piezoelectric substrate 14 with intervention of underlying metal layers 17 in a manner similar to the first exemplary embodiment. As these acoustic absorbers 18 and the acoustic absorber 18 between the SAW units 27 are of the same thickness and their main surfaces are formed parallel to the surface of the piezoelectric substrate 14, it enables secure sucking of a SAW element 13 with a vacuum chuck shown in FIG. 3 and mounting in a package 10.

By employing this structure, the effect of absorbing spurious waves can be further enhanced compared with the SAW device of the ninth exemplary embodiment.

Figure 21:
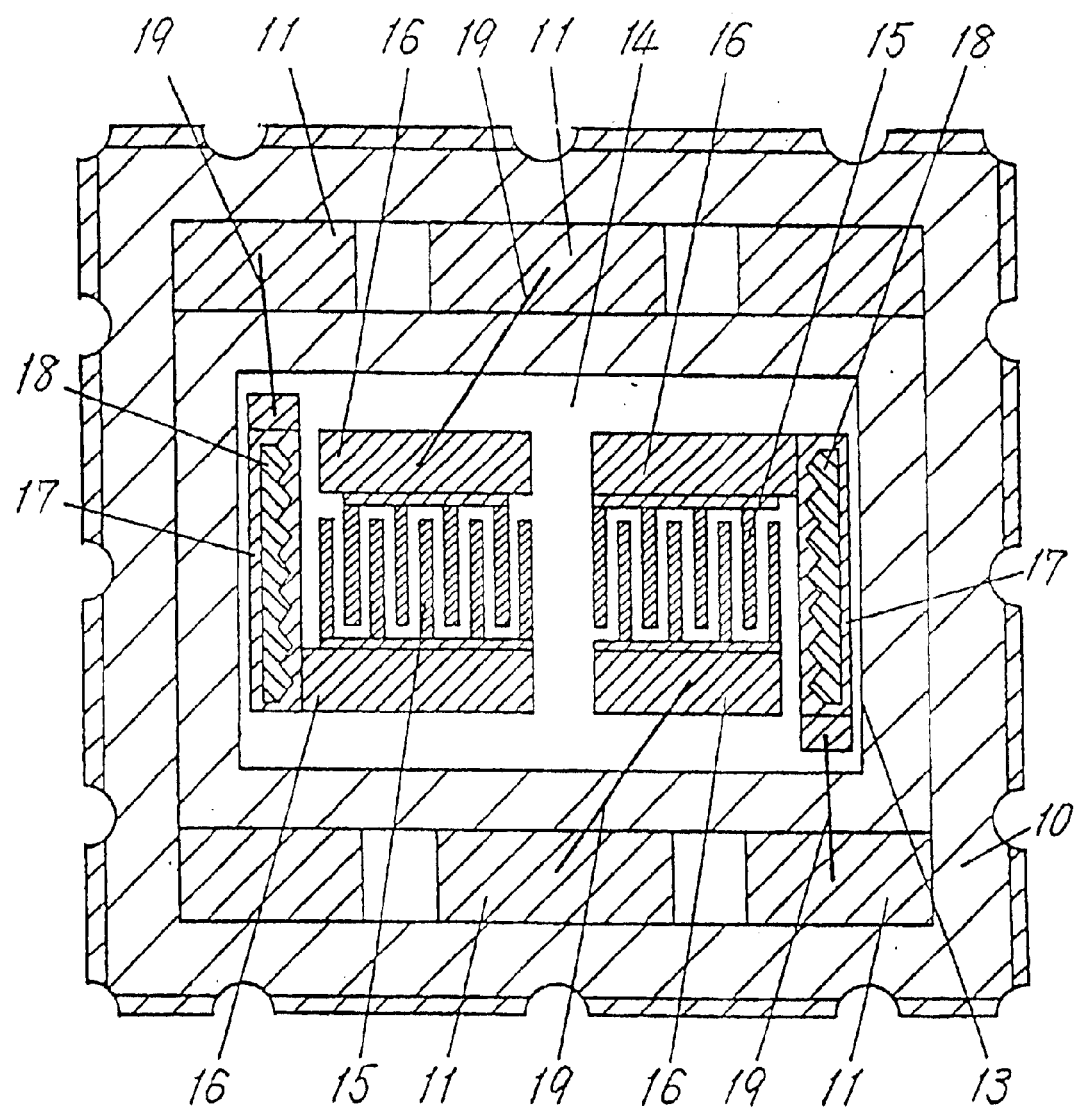
FIG. 21 is a top view of a SAW device before sealing with a lid in an eleventh exemplary embodiment of the present invention.

Eleventh Exemplary Embodiment:

Referring to FIG. 21, a description will be given on an eleventh exemplary embodiment of the present invention.

When trying to minimize the inductance between connection electrodes 16 and external terminals 11 by shortening thin metal wires 19 connecting the connection electrodes 16 and the external terminals 11, a wiring electrode is generally provided from the connection electrodes 16 to an end of a piezoelectric substrate 14 which is close to the external terminals 11 to be connected.

However, by connecting the connecting electrodes 16 with underlying metal layers 17, and connecting the external terminals 11 to be connected with the underlying metal layers 17 using thin metal wires 19 as in this exemplary embodiment illustrated in FIG. 21, the thin metal wires 19 can be shortened without newly providing a wiring electrode.

In this way, downsizing of a SAW device can be achieved.

Here, the SAW device of this exemplary embodiment is fabricated according to the method of manufacture described in the first exemplary embodiment with the exception that the connection electrodes 16 and the underlying metal layers 17 are made in a connected state. As acoustic absorbers 18 provided between IDT electrodes 15 and an end of a piezoelectric substrate 14 are of the same thickness as in the first exemplary embodiment, and the top surfaces of them are formed parallel to the surface of the piezoelectric substrate 14, it enables secure sucking of a SAW element 13 with a vacuum chuck shown in FIG. 3 and mounting of it in a package 10.

Figure 22:
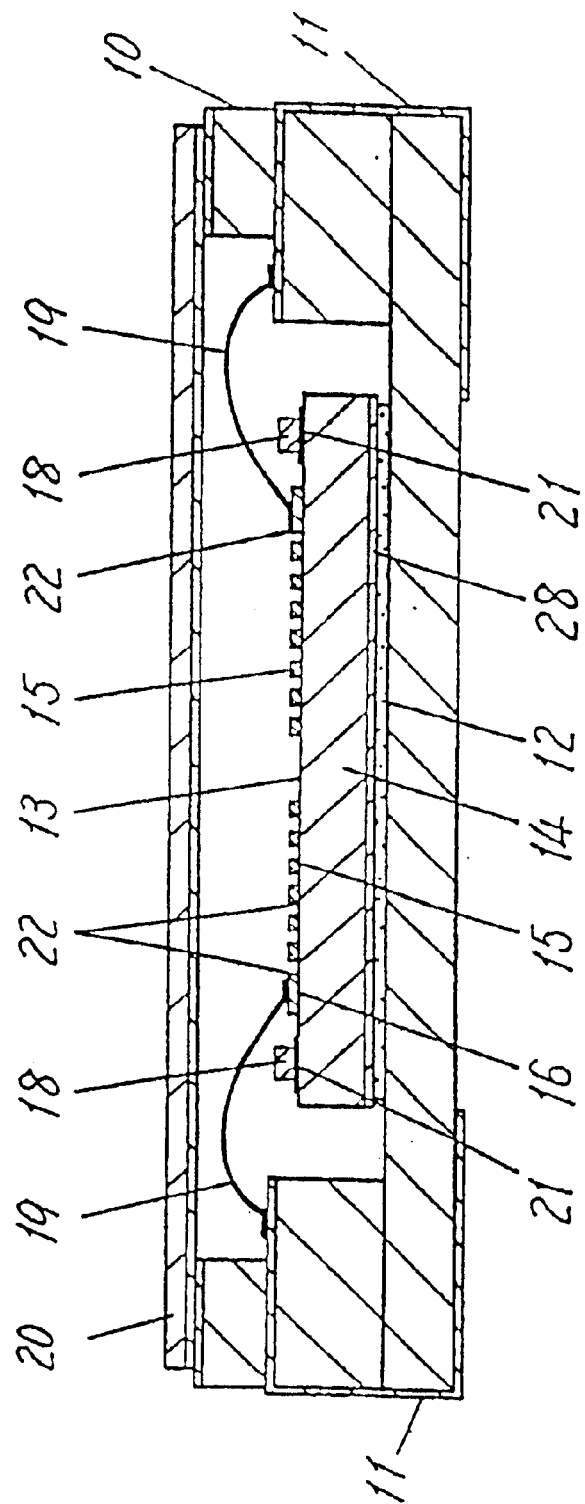
FIG. 22 is a cross-sectional view of a SAW device in a twelfth exemplary embodiment of the present invention.
Figure 23:
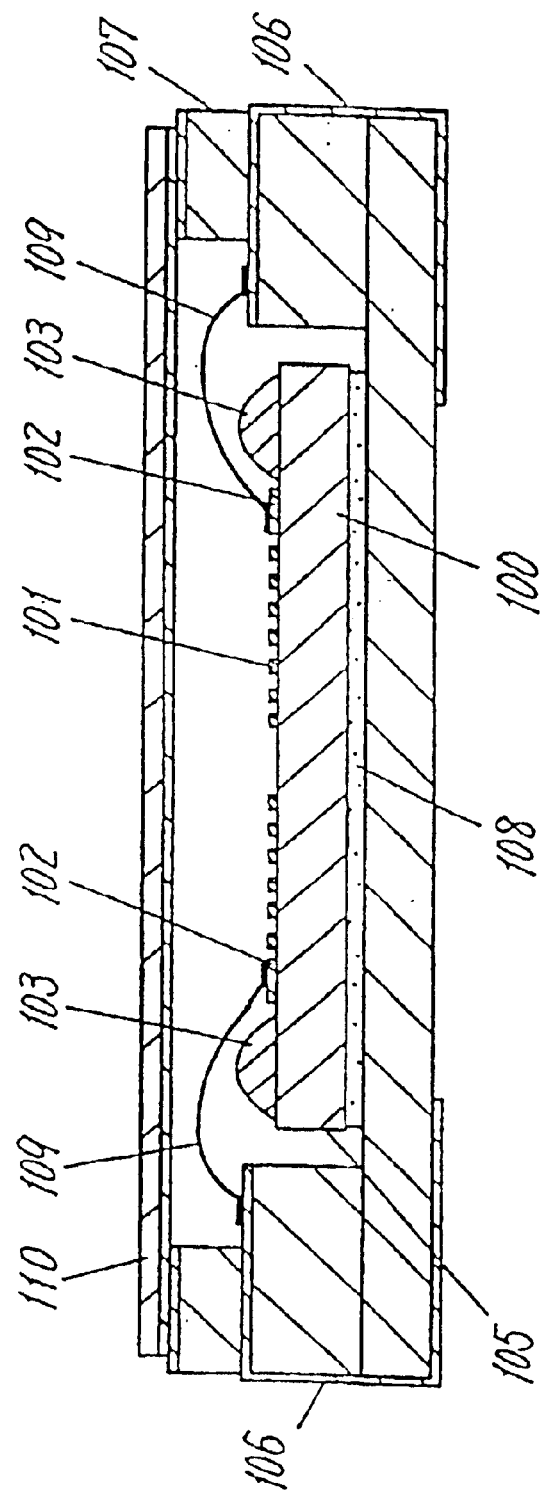
FIG. 23 is a cross-sectional view of a conventional SAW device.

Twelfth Exemplary Embodiment:

Referring to FIG. 22, a description will be given on a twelfth exemplary embodiment of the present invention.

In this exemplary embodiment, an antireflective film 28 of amorphous silicon or silicon nitride that absorbs light well is formed over the entire rear surface of a wafer composed of crystal, LiTaO3, LiNbO3, or the like.

A uniform thickness vapor deposited film consisting of aluminum or a metal having aluminum as the main constituent is formed on the main surface of such a wafer. Subsequently, a positive photoresist is uniformly spin coated on the vapor deposited film.

Next, the photoresist is exposed in a manner such that IDT electrodes 15 having a desired shape and connection electrodes 16 to be connected to the IDT electrodes 15 can be formed. In this case, as the antireflective film 28 has been formed on the rear surface of the wafer, it absorbs the light passing the wafer and prevents light from reflecting on the main surface of the wafer.

Next, the photoresist is developed to form IDT electrodes 15 and connection electrodes 16, and an electrically insulating protective film 22 is formed by anodic oxidation on the surface of the IDT electrodes and connection electrodes 16 including their sides.

Subsequently, in the same manner as in the second exemplary embodiment, coupling layers 21 are formed at least at the location on the wafer surface where acoustic absorbers 18 are to be formed.

Next, the entire surface of the wafer on which the IDT electrodes 15 have been formed is covered with a negative photosensitive film resist, which is then pressed while being heated. As the film resist, one having the same thickness as that of the acoustic absorbers 18 to be formed is used.

Next, the portion of the film resist that will form the acoustic absorbers 18 is exposed. In this case, too, the antireflective film 28 on the rear surface of the wafer absorbs light passing through the wafer and prevents it from reflecting on the main surface of the wafer.

Afterwards, development is made to obtain acoustic absorbers 18. After development, moisture in the acoustic absorbers 18 is removed to improve adhesion with a piezoelectric substrate 14.

Thereafter, a SAW device shown in FIG. 22 is fabricated in the same manner as in the first exemplary embodiment.

In this SAW device, as the acoustic absorbers 18 on both sides of the IDT electrodes 15 have the same thickness as in the first exemplary embodiment and are formed in a manner such that their top surfaces are parallel to the surface of the piezoelectric substrate 14, it enables secure sucking of a SAW element 13 with a vacuum chuck 30 shown in FIG. 3 and mounting of it in a package 10.

In the meantime, although the antireflective film 28 is formed in this exemplary embodiment before a vapor deposited metal film is formed, acoustic absorbers 18 having superior configurational accuracy can be obtained by forming the antireflective film 28 before exposing the film resist that will form the acoustic absorbers 18. However, the IDT electrodes 15 and the connection electrodes 16 can be formed with higher accuracy when the antireflective film 28 is formed before forming the IDT electrodes 15.

Also, although the antireflective film 28 is formed over the entire rear surface of the wafer, it is preferable to form it larger than at least the portions that will form the acoustic absorbers 18, IDT electrodes 15, and connection electrodes 16 so that transmitting light that reflects on the rear surface of the wafer will not impinge on the photosensitive resin that will form the acoustic absorbers 18 and the IDT electrodes 15 and the photosensitive resin that will form the connection electrodes 16.

A description of the gist of the present invention will be given in the following.

(1) In each of the above-mentioned exemplary embodiments, the acoustic absorbers 18 are formed using a film type negative photosensitive resin in order that they can be stably fabricated with a higher sound absorbing effect, smaller area, and lower profile. However, similar effect is obtainable by coating on a wafer a photosensitive resin solution by spin coating and the like to a uniform thickness. At this time, as the thickness achievable by a single spin coating is small, spin coating of the photosensitive resin solution may be repeated several times to adjust to a desired thickness of the acoustic absorbers 18.

(2) In each of the above-mentioned exemplary embodiments, the acoustic absorbers 18 are formed using a photosensitive resin selected from the group consisting of epoxy resin, acrylic resin, and polyimide resin that are resilient and can efficiently absorb spurious waves. In particular, acrylic resin is preferable because of its superior adhesion to a piezoelectric substrate 14.

(3) While the acoustic absorbers 18 may be formed in a nearly square shape, it is preferable to form them in a manner such that the end portions of the acoustic absorbers 18 on the side of the IDT electrodes 15 are saw-toothed as shown in each of the above exemplary embodiments so that scattering effect can be obtained in addition to sound absorbing effect, thereby enhancing suppression of spurious waves. Also, peeling off the acoustic absorbers 18 from the piezoelectric substrate 14 by pressure of water spray, for instance, applied when dicing a wafer can be prevented by making the shape as cornerless as possible, and making a corner obtuse even when forming a corner as described in each of the above exemplary embodiments.

(4) A sufficient sound absorbing effect can be obtained by making the smallest width portion of the acoustic absorbers 18 in the direction of SAW transmission equal to or greater than $0.5\lambda$ ($\lambda$=SAW wavelength).

(5) It is preferable to make the length of the acoustic absorbers 18 in the direction orthogonal to the direction of SAW transmission equal to or greater than the length of the IDT electrodes 15 in the same direction. This is because, as SAW has a diffraction effect as a property of waves, a sufficient sound absorbing effect is obtained by making the length equal to or greater than the length of the IDT electrodes 15 in the same direction.

(6) In forming the acoustic absorbers 18 having superior configurational accuracy by photolithographic method as in the present invention, at least one of the following three methods can be employed.

The first is a method in which an underlying metal layer 17 is formed on the surface of a wafer in order not to allow light for film resist exposure from being transmitted to the rear surface of the wafer during the process of forming the acoustic absorbers 18. This method is most preferable as the underlying metal layer 17 can be formed simultaneously with the formation of the IDT electrodes 15 and connection electrodes 16 thus making a separate process unnecessary.

The second is a method in which rear surface of the wafer is roughened to scatter reflected light so as to avoid imping-ing of reflected light from the rear surface of the wafer when exposing film resist for making acoustic absorbers.

The third is a method in which an antireflective film 28 is formed on the rear surface of the wafer so as to absorb transmitted light.

When forming the underlying metal layer 17 and the antireflective film 28, the size of the antireflective film 28 is made larger than the acoustic absorbers 18 to be formed in order to ensure the above effect.

(7) In forming the acoustic absorbers 18, when using a film resist which is equal to or smaller in size than the wafer but larger than the portion making SAW element 13, or when using a film resist larger than the wafer, it is preferable to cut it after putting it to the wafer to a size equal to or smaller than the wafer and larger than the portion forming a SAW element 13. The reason is because, if the film resist is larger than the wafer, there is a possibility that the film resist may peel off, or smooth transfer may be hindered, by catching on the transfer device when transferring the wafer for exposure and development.

(8) In the second or the fifth exemplary embodiment, a coupling agent is coated over the entire surface of the piezoelectric substrate 14. As a result, a coupling layer 21 is formed not only between the piezoelectric substrate 14 and the acoustic absorbers 18 but also on the surfaces of the IDT electrodes 15. However, as the coupling layer 21 does not do any harm on the characteristics of the SAW device, it is not necessary to remove it.

(9) It is preferable to make the bottom surfaces (on the side of the piezoelectric substrate 14) larger than the top surfaces of the acoustic absorbers 18 thereby to improve adhesion strength with the piezoelectric substrate 14.

(10) Although a silicone resin is used as the filler 25, other thermosetting resin may also be used. However, it is preferable that the filler 25 is a material that has higher resilience than that of the acoustic absorbers 18 so that stress applied to the SAW element 13 due to thermal expansion and the like can be relieved.

(11) When heating or cooling the piezoelectric substrate 14, it is preferable to avoid abrupt temperature change in order to prevent pyroelectric destruction.

(12) By carrying out anodic oxidation on the surfaces of the IDT electrodes 15, connection electrodes 16, and underlying metal layers 17 and covering their surfaces with an electrically insulating layer, short-circuit between electrodes can be prevented in the event an electrically conductive foreign object drops on the surface of the SAW element 13.

INDUSTRIAL APPLICABILITY

According to the present invention, by forming acoustic absorbers having the same thickness and main surfaces parallel to the surface of a piezoelectric substrate, mounting failure can be prevented when mounting a SAW element in a package.

What is claimed is:

1. A method of manufacture of a surface acoustic wave device comprising:
   a first step of forming on a substrate composed of a piezoelectric material at least an interdigital transducer electrode and a connection electrode connected to said interdigital transducer electrode;
   a second step of applying with a pressure a photosensitive film resist on the surface of said substrate and forming a photosensitive film resist layer over at least a portion of a surface of said substrate on which an acoustic absorber is to be formed later;
   a third step of forming acoustic absorbers only at the two sides orthogonal to the direction of the surface acoustic wave transmission by exposing and developing that part of said photosensitive film resist layer which will form acoustic absorbers, and forming a plurality of surface acoustic wave elements on said substrate;

a fourth step of placing in a package a surface acoustic wave element obtained by cutting and dividing said substrate and electrically connecting a connection electrode of said surface acoustic wave element with an external terminal of said package; and a fifth step of sealing an opening of said package with a lid, wherein the main surface of said acoustic absorbers is formed parallel to the surface of said substrate.

2. The method of manufacture of a surface acoustic wave device of claim 1, wherein the thickness of said photosensitive film resist layer in the second step is equal to or less than that of the substrate composed of a piezoelectric material and is greater than the thickness of the portion where a surface acoustic wave element is formed.

3. The method of manufacture of a surface acoustic wave device of claim 1, wherein an underlying metal layer is formed in the first step together with an interdigital transducer electrode at the location where acoustic absorbers are to be formed.

4. The method of manufacture of a surface acoustic wave device of claim 1, wherein a protective layer is provided on the surface of said interdigital transducer electrode after the first step and prior to the second step.

5. The method of manufacture of a surface acoustic wave device of claim 4, wherein said protective layer is formed by anodic oxidation.

6. The method of manufacture of a surface acoustic wave device of claim 4, wherein said protective layer has a higher resistance to developing solution for the photosensitive film resist layer forming the acoustic absorbers than that of the main metal constituting said interdigital transducer electrode.

7. The method of manufacture of a surface acoustic wave device of claim 1, wherein a metal film is formed on the surface of said substrate composed of a piezoelectric material prior to the first step and an electrically insulating layer is formed on the surface of said metal film by anodic oxidation.

8. The method of manufacture of a surface acoustic wave device of claim 1, wherein a silane-based coupling layer is formed after the first step and prior to the second step at the location on said substrate composed of a piezoelectric material where acoustic absorbers are to be formed.

9. The method of manufacture of a surface acoustic wave device of claim 1, wherein an antireflective film is provided prior to the first step in a region on the rear surface of said substrate composed of a piezoelectric material opposite the location with intervention of said piezoelectric substrate with intervention of said piezoelectric substrate where acoustic absorbers are to be formed.

10. The method of manufacture of a surface acoustic wave device of claim 1, wherein a step of making the rear surface of said substrate composed of a piezoelectric material rough to scatter light is included prior to the first step.

* * * * *